US 9,691,446 B2

(12) United States Patent
Shimizu

(10) Patent No.: US 9,691,446 B2
(45) Date of Patent: Jun. 27, 2017

(54) MEMORY DEVICE

(71) Applicant: KABUSHIKI KAISHA TOSHIBA, Minato-ku, Tokyo (JP)

(72) Inventor: Naoki Shimizu, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/065,852

(22) Filed: Mar. 9, 2016

(65) Prior Publication Data
US 2017/0076761 A1 Mar. 16, 2017

Related U.S. Application Data

(60) Provisional application No. 62/217,687, filed on Sep. 11, 2015.

(51) Int. Cl.
G11C 7/22 (2006.01)
G11C 7/10 (2006.01)
G11C 13/00 (2006.01)

(52) U.S. Cl.
CPC ............... *G11C 7/106* (2013.01); *G11C 7/22* (2013.01); *G11C 7/1048* (2013.01); *G11C 7/1078* (2013.01); *G11C 7/1096* (2013.01); *G11C 13/0069* (2013.01)

(58) Field of Classification Search
CPC .......... G11C 7/00; G11C 7/10; G11C 7/1048; G11C 7/1078; G11C 7/1096; G11C 7/22; G11C 13/0069
USPC .............. 365/189.05, 148, 158, 163, 189.14, 365/189.15, 189.16, 233.1
See application file for complete search history.

(56) References Cited

U.S. PATENT DOCUMENTS

| 6,205,064 B1 | 3/2001 | Ooishi | |
| 6,246,614 B1 | 6/2001 | Ooishi | |
| 2008/0031043 A1* | 2/2008 | Aochi | G11C 11/5614 365/185.03 |
| 2014/0068154 A1 | 3/2014 | Hoya | |
| 2015/0063020 A1* | 3/2015 | Kajigaya | G11C 11/1675 365/158 |

FOREIGN PATENT DOCUMENTS

JP 2003297082 A 10/2003

* cited by examiner

Primary Examiner — Tan T. Nguyen
(74) Attorney, Agent, or Firm — Holtz, Holtz & Volek PC

(57) ABSTRACT

A memory device according to one embodiment includes a memory cell which transitions to a first state or a second state by a first current through the memory cell; and a first circuit configured to stop supplying the first current when a first number of cycles of a clock signal lapses from reception of write data.

18 Claims, 20 Drawing Sheets

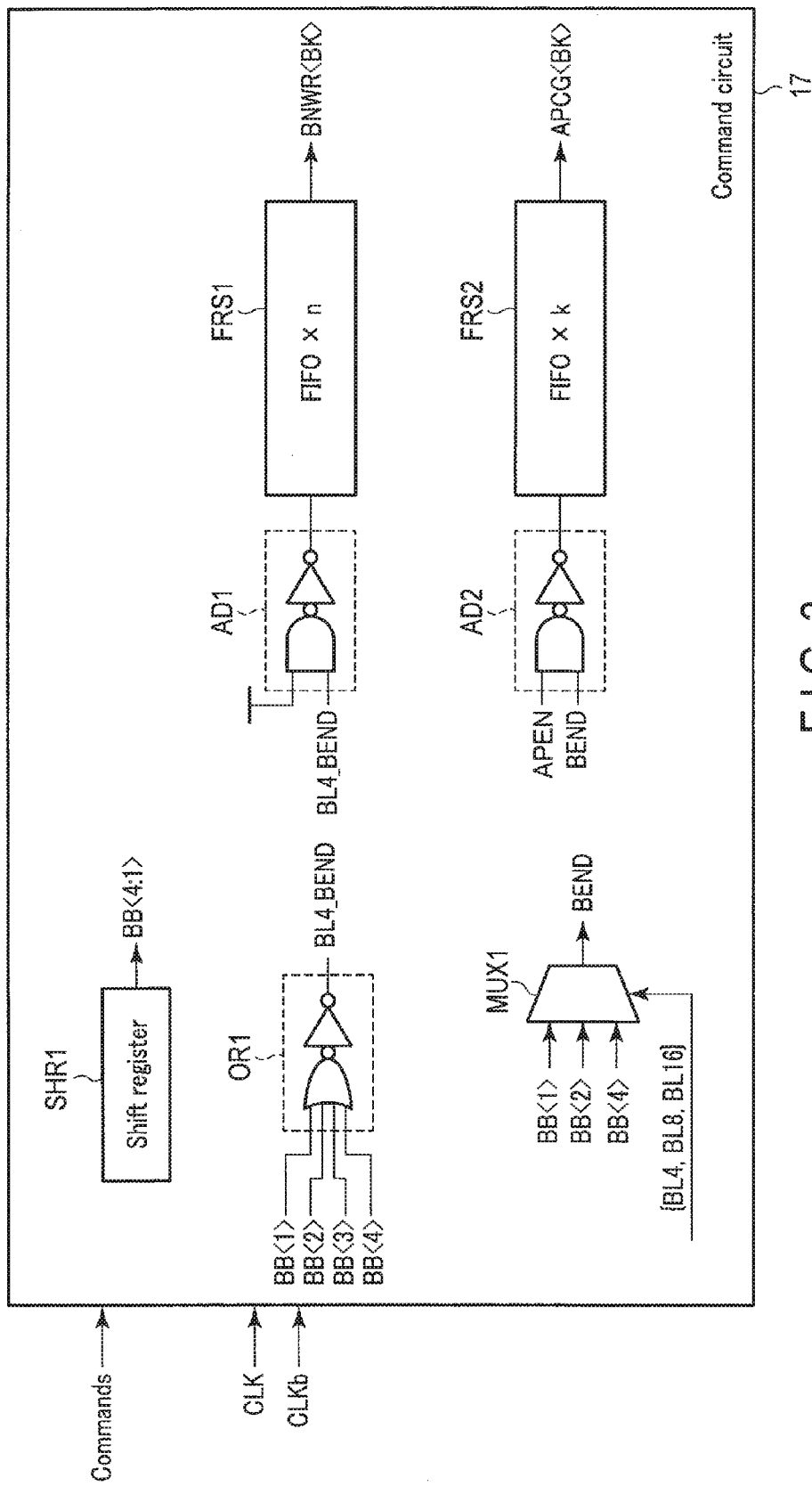
F I G. 3

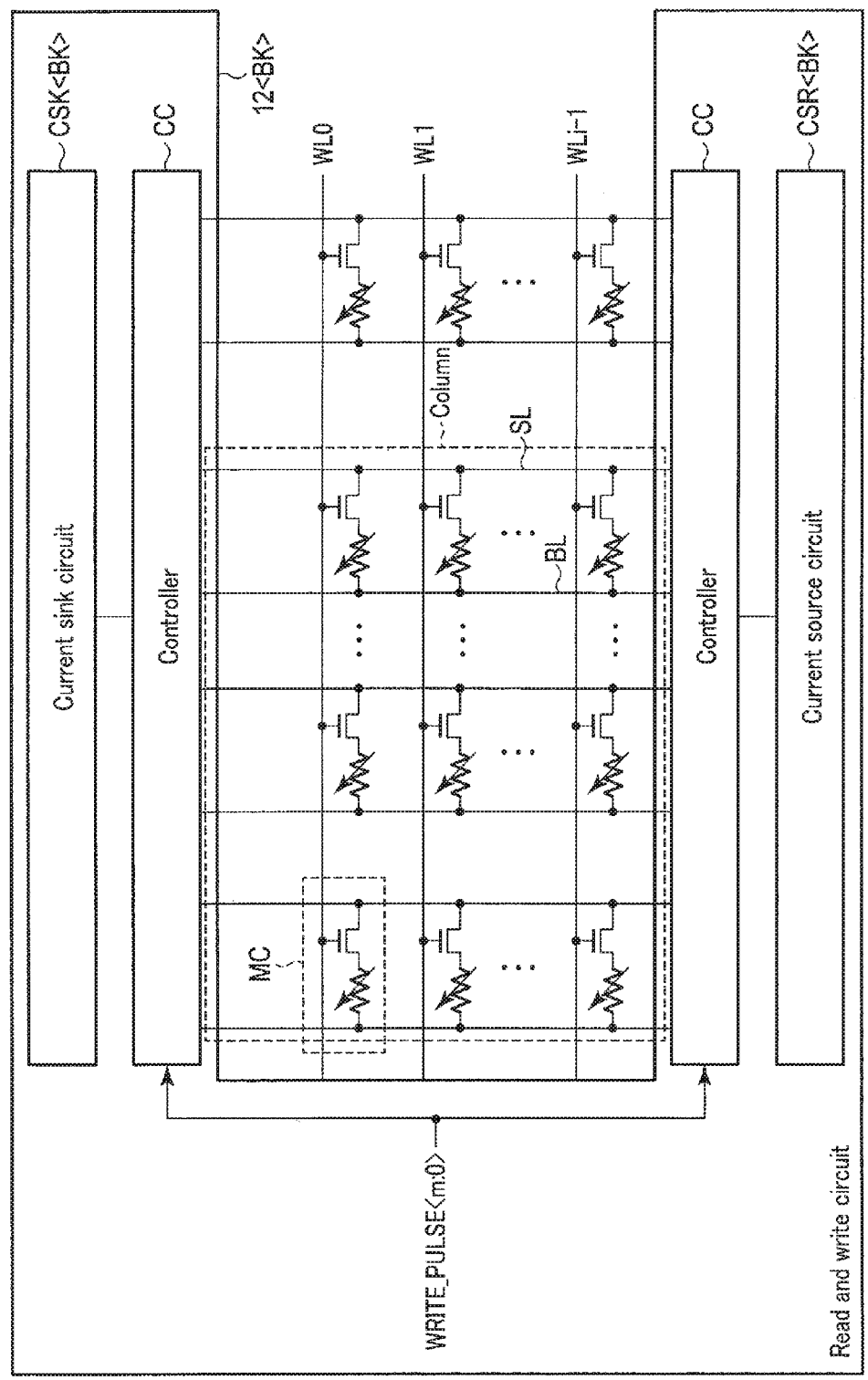
F I G. 5

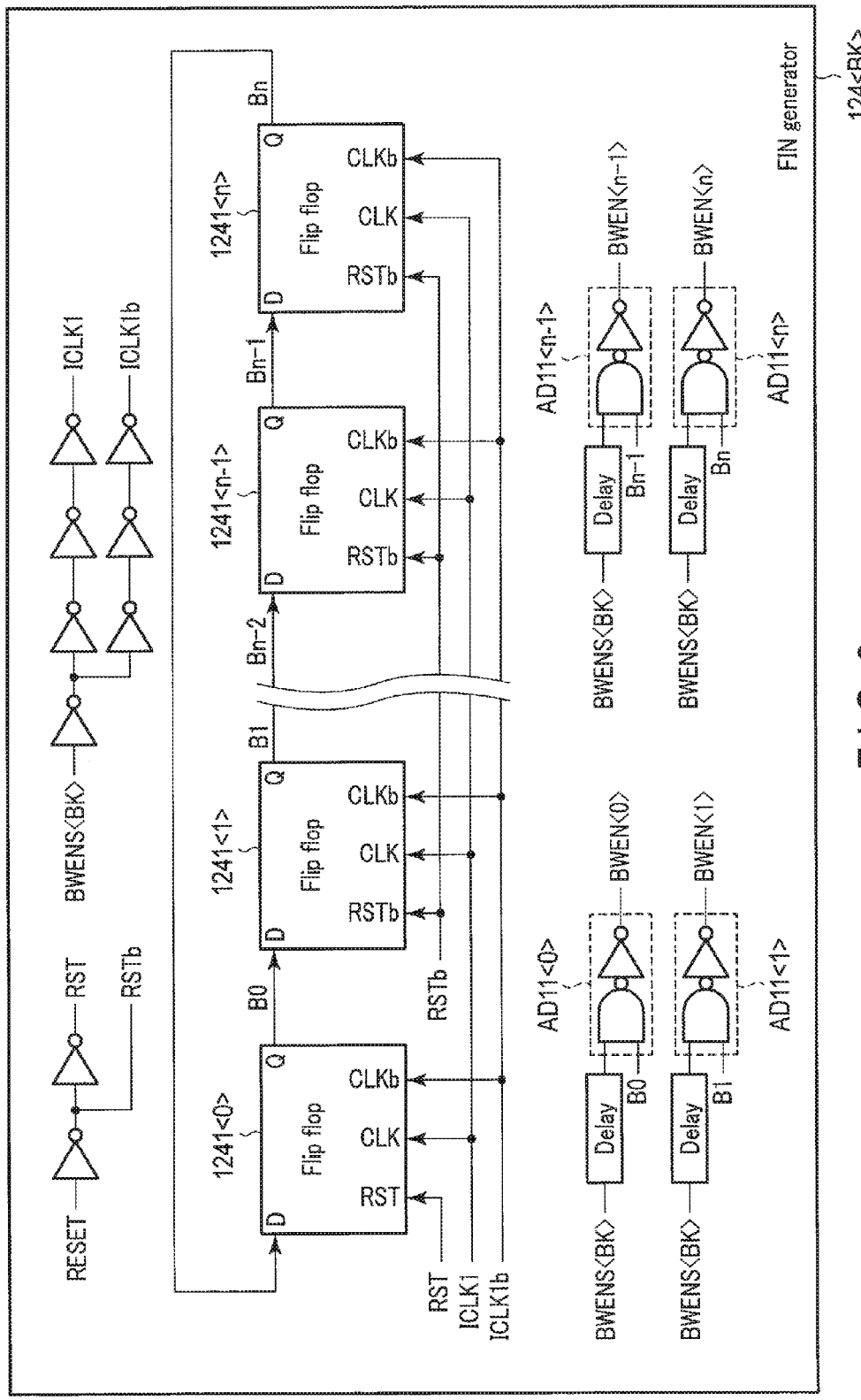
F I G. 6

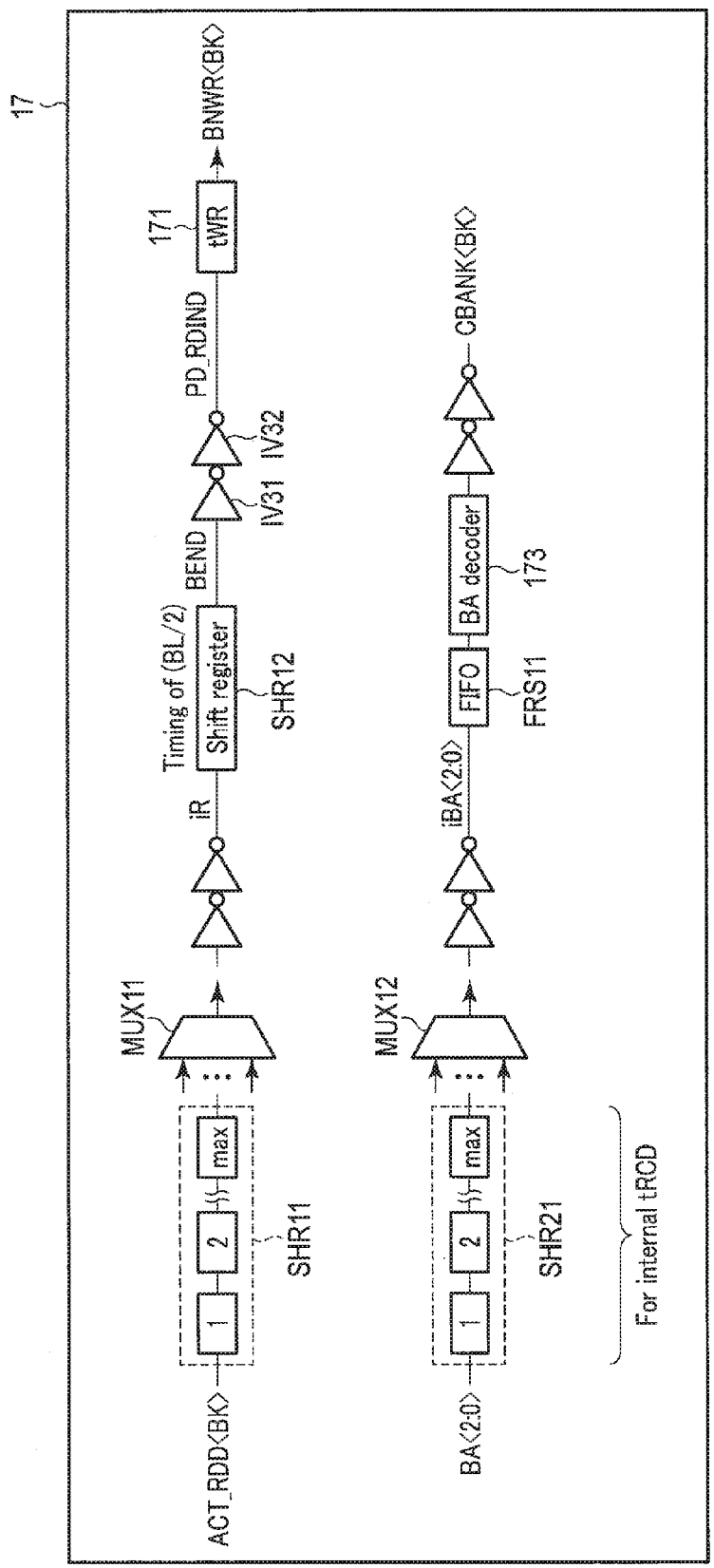
F I G. 12

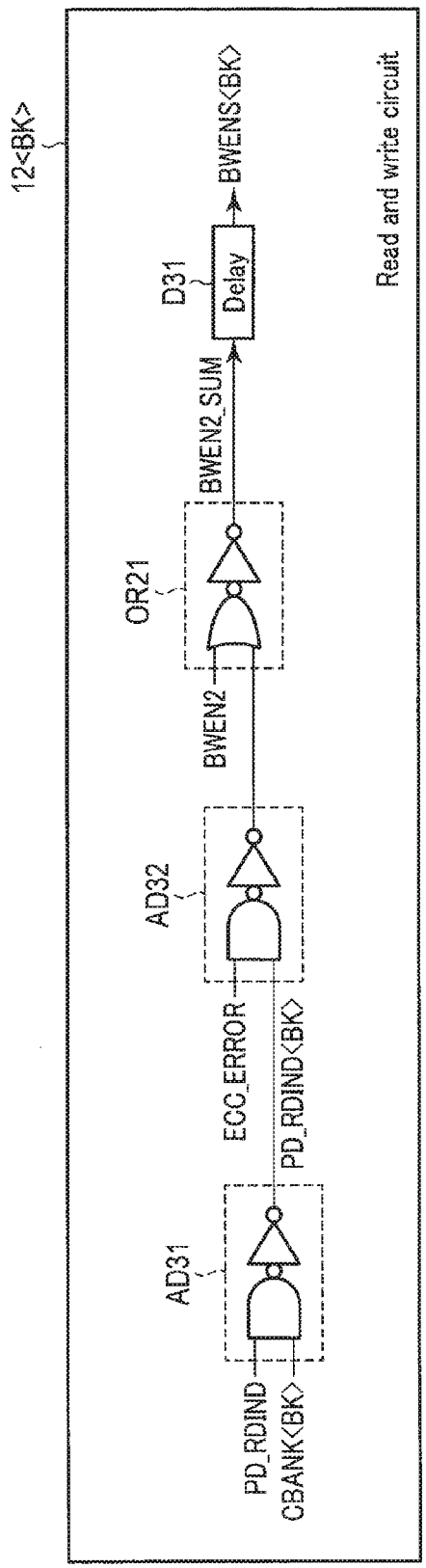
F I G. 14

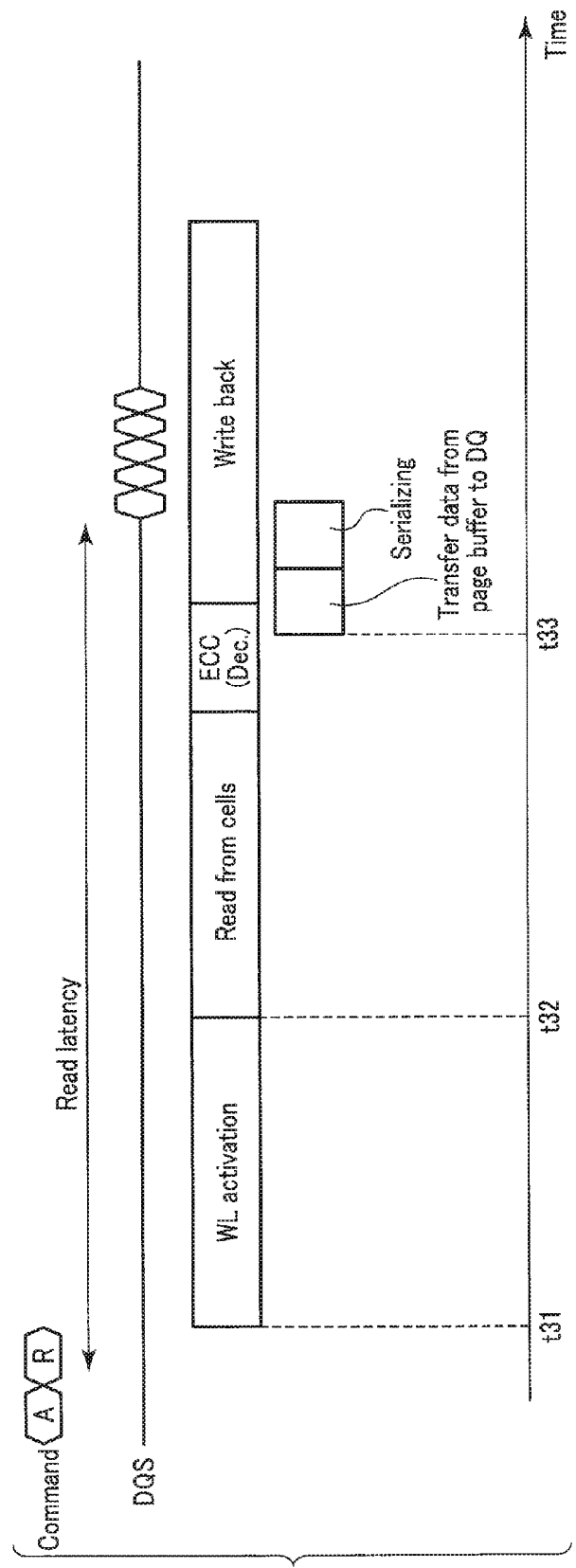
F I G. 18

| NWR<3> | NWR<2> | NWR<1> | NWR<0> |
|---|---|---|---|
| 0 | 0 | 0 | 1 |
| 0 | 0 | 1 | 0 |
| 0 | 1 | 0 | 0 |
| 1 | 0 | 0 | 0 |

⇑

| A<2> | A<1> | A<0> |
|---|---|---|
| 0 | 0 | 1 |
| 0 | 1 | 0 |
| 0 | 1 | 1 |
| 1 | 0 | 0 |

⇑

| NWR<3> | NWR<2> | NWR<1> | NWR<0> |
|---|---|---|---|
| 0 | 0 | 0 | 1 |
| 0 | 0 | 1 | 0 |
| 0 | 1 | 0 | 0 |
| 1 | 0 | 0 | 0 |

F I G. 20

MEMORY DEVICE

CROSS-REFERENCE TO RELATED APPLICATIONS

This application claims the benefit of U.S. Provisional Application No. 62/217,687, filed Sep. 11, 2015, the entire contents of which are incorporated herein by reference.

FIELD

Embodiments relate to a memory device.

BACKGROUND

Memory devices using a magnetoresistive effect are known.

BRIEF DESCRIPTION OF THE DRAWINGS

FIG. 3 illustrates some components and connections of a command circuit of the memory device of the first embodiment;

FIG. 5 illustrates other components and connections of the functional blocks of the read and write circuit of the memory device of the first embodiment;

FIG. 6 illustrates components and connections of an FIN generator of the memory device of the first embodiment;

FIG. 12 illustrates other components and connections of the command circuit of the memory device of the second embodiment;

FIG. 14 illustrates a part of a read and write circuit of the second embodiment;

FIG. 18 illustrates a read and a write back in the memory device for reference;

FIG. 20 illustrates coding and decoding of signals in the memory device of the third embodiment.

DETAILED DESCRIPTION

Figure 1:
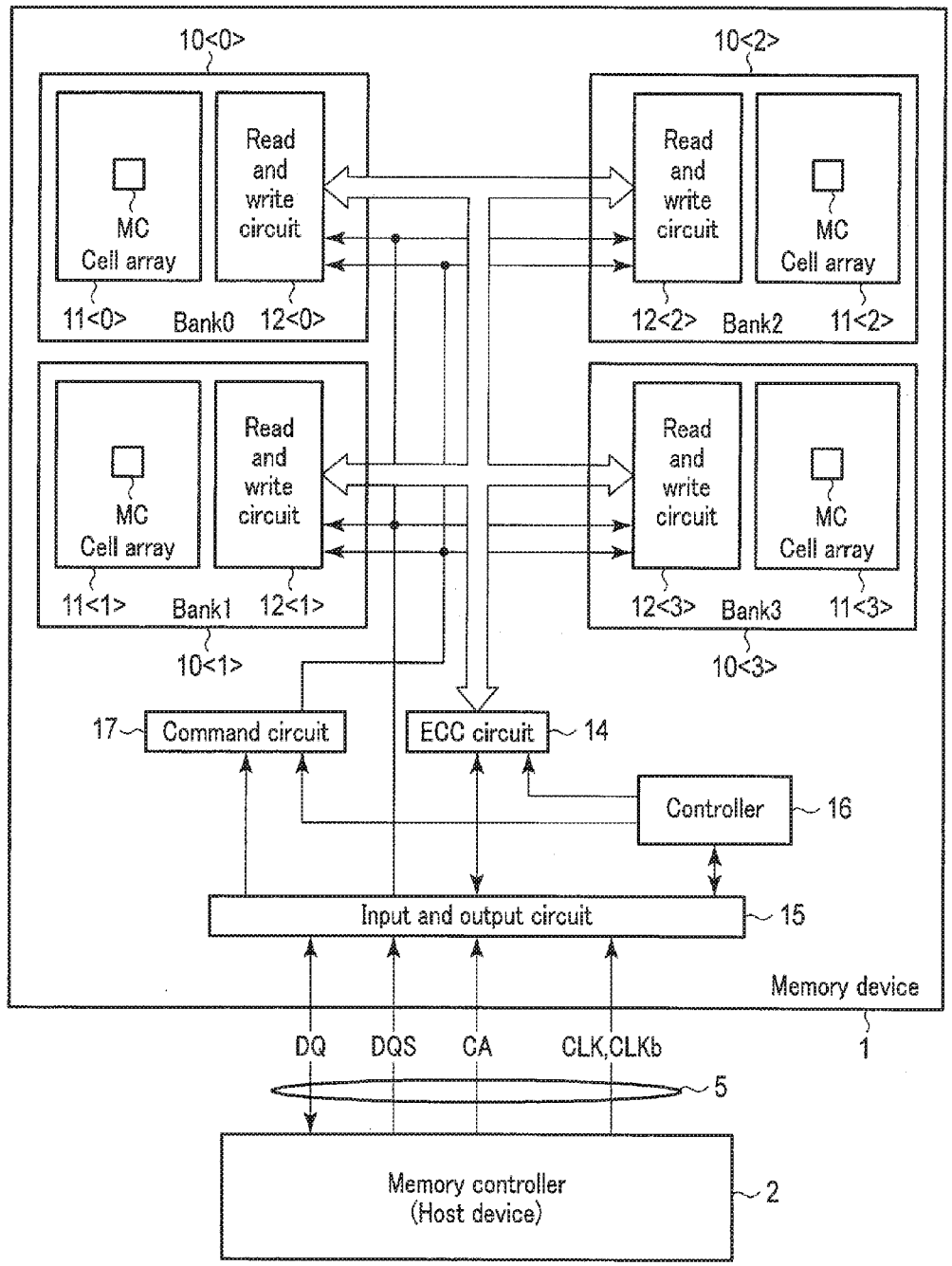
FIG. 1 illustrates functional blocks of a memory device and a memory controller of a first embodiment.

A memory device according to one embodiment includes a memory cell which transitions to a first state or a second state by a first current through the memory cell; and a first circuit configured to stop supplying the first current when a first number of cycles of a clock signal lapses from reception of write data.

Embodiments will now be described with reference to the figures. In the following description, components with substantially the same functionalities and configurations will be referred to with the same reference numeral, and repeated description may be omitted. Moreover, the description for a particular embodiment is also applicable as a description of another embodiment, unless stated otherwise.

Each functional block can be implemented as hardware, computer software, or a combination of the both. It is not necessary that functional blocks are distinguished as in the following examples. For example, some of the functions may be implemented by functional blocks different from those illustrated below. Furthermore, an illustrated functional block may be divided into functional sub-blocks.

<First Embodiment>

FIG. 1 illustrates functional blocks of a memory device 1 and a memory controller (or, host device) 2 of the first embodiment. The memory device 1 and the memory controller 2 form a memory system. The memory device 1 is, for example, a dynamic random access memory (DRAM), a magnetoresistive RAM (MRAM), a resistive RAM (ReRAM), or a phase change RAM (PCRAM). The following description is based on the example of the memory device 1 being an MRAM.

The memory device 1 is coupled to the memory controller 2 by a connection line 5. The memory device 1 receives a power voltage, a command or address signal CA, data DQ, a data strobe signal DQS, and clocks CLK and CLKb on the connection line 5. The sign b at the end of the name of a signal indicates the inversion logic of the signal name without the sign b. The address signal includes an address. Moreover, the memory device 1 transmits data DQ to the memory controller 2 through the connection line 5.

The memory controller 2 includes components, such as a central processing unit (CPU), a RAM, and a read only memory (ROM), and controls the memory device 1 with commands.

The memory device 1 includes banks 10 (10<0> to 10<3>), an error correction code (ECC) circuit 14, an input and output circuit 15, a controller 16, and a command circuit 17. The memory device 1 includes, for example, eight banks 10, but FIG. 1 illustrates only four banks.

The bank 10<BK> includes a cell array 11<BK> and a read and write circuit 12<BK>. The value BK is an identifier (or, address) of a bank, and is zero or a natural number of 7 or less when based on the example of eight banks 10. Each cell array 11 includes plural memory cells MC. The memory cells MC store data in a non-volatile manner. The area of the memory cell array 11 is provided with various signal lines (not shown). The signal lines include bit lines BL, source lines SL, and word lines WL, which will be described later.

Each read and write circuit 12 controls writes to the corresponding cell array 11, and reads from the corresponding cell array 11. Each read and write circuit 12 includes components, such as drivers, decoders, a page buffer, and a sense amplifier. The decoders select memory cells MC specified by the address signal from the memory controller 2, and include a row decoder and a column decoder. The page buffer temporarily stores data to and from the corresponding bank 10. The read and write circuit 12 applies various voltages to or sends various currents through the signal lines, and distinguishes data from selected memory cells MC, or writes specified data in selected memory cells MC.

The input and output circuit 15 controls transmission of signals between the memory device 1 and the memory controller 2. The input and output circuit 15 is coupled to the command circuit 17, the read and write circuits 12, the ECC circuit 14, and the controller 16.

The input and output circuit 15 supplies the commands and address signal which were received from the memory controller 2 to the command circuit 17. The command circuit 17 receives the clocks CLK and CLKb, and can output various signals at timings based on the clocks CLK and CLKb. The command circuit 17 supplies signals which are based on the commands and address signal to the read and write circuits 12.

The input and output circuit 15 supplies the address signal to the read and write circuits 12. The read and write circuit 12s control reads of data from the memory cells MC and writes of data to the memory cells MC based on the address signal.

The ECC circuit 14 adds an error correction code (ECC) to data which will be written in the memory cell MC. The ECC circuit 14 decodes the ECC in data received from the memory cells MC to correct errors of the received data, and generates read-target data.

The input and output circuit 15 supplies various control signals to the controller 16. The controller 16 includes components, such as a voltage generator, and controls the components of the memory device 1 based on the received control signal.

Figure 2:
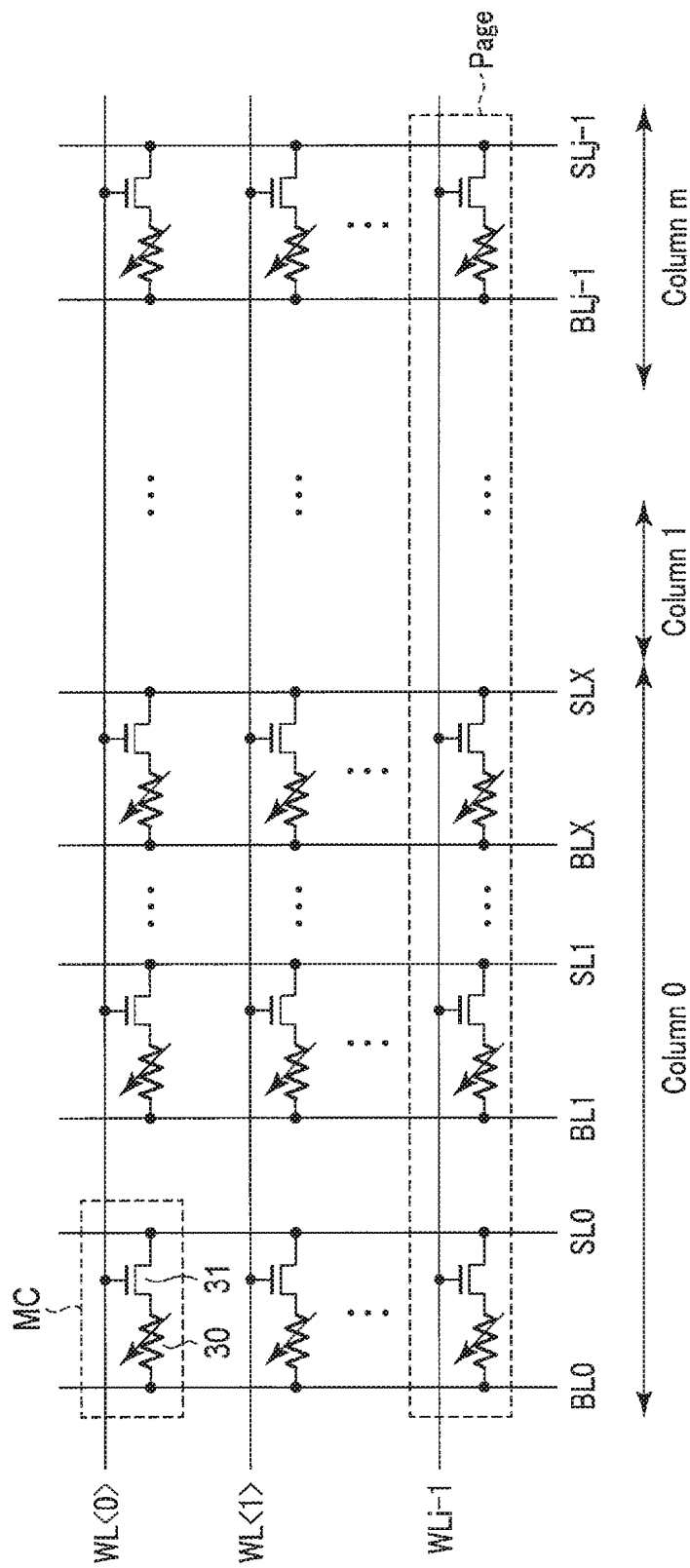
FIG. 2 illustrates components and connections of a cell array of the memory device of the first embodiment.

The cell arrays 11 will now be described in detail with FIG. 2. FIG. 2 illustrates components and connections of a cell array 11. The memory cells MC are arranged in a matrix, for example. The cell array 11 is provided with i word lines WL (WL0 to WLi−1), j bit lines BL (BL0 to BLj−1), and j source lines SL (SL0 to SLj−1). i and j are natural numbers. One word line WL is coupled to memory cells MC of one row, and a pair of a bit line BL and a source line SL is coupled to memory cells MC of one column.

Each memory cell MC includes a magnetic tunnel junction (MTJ) element 30 and a select transistor 31. The MTJ element 30 includes the MTJ, and includes two magnetic layers and a nonmagnetic layer therebetween. The first magnetic layer has an invariable magnetization, or orientation of magnetic anisotropy. The second magnetic layer has a variable magnetization orientation. When the magnetization orientations of the two magnetic layers are parallel and antiparallel, the MTJ element exhibits the minimum and maximum resistances, respectively. The states which exhibit the switchable different resistances are assigned to binary data, respectively. When a write current flows from the first magnetic layer to the second magnetic layer, the magnetization orientations of the two magnetic layers come to be parallel. When a write current flows from the second magnetic layer to the first magnetic layer, the magnetization orientations of the two magnetic layers come to be antiparallel. That the magnetization orientation of the first magnetic layer is invariable indicates that the magnetization orientation does not flip by the write current which flows through the MTJ element 30.

The select transistor 31 is, for example, an n-type metal oxide semiconductor field effect transistor (MOSFET).

One end of each MTJ element 30 is coupled to one bit line BL, and the other end is coupled to the drain (or source) of one select transistor 31. Each select transistor 31 is coupled to one word line WL at the gate, and to one source line SL at the source (or drain).

When a particular word line WL is activated by the read and write circuit 12, the select transistor 31 coupled to that word line WL turns on. The select transistors 31 allows an MTJ element 30 coupled to a turned-on select transistor 31 to be coupled to a bit line BL and source line SL pair. The set of memory cells MC coupled to one word line WL is referred to as a "page."

Plural pairs of bit lines BL and source lines SL belong to one column. Each bank 10<BK> includes m+1 column 0 to column m. The target of a read and a write is specified by specification of the address of a page, i.e., specification of a word line WL and specification of a column. In a read, the data of all the memory cells MC coupled to a word line WL selected for read is read to a page buffer (not shown), for example. A section of the one-page-size data is further selected by a column address, and the data in the section of the one-page size data in the column specified by the column address is read. A write is also accompanied by specification of a target page and a column. The column address is specified by a read command or write command, for example.

FIG. 3 illustrates some components of the command circuit 17. The command circuit 17 receives the clocks CLK and CLKb, and operates based on the clocks CLK and CLKb.

The command circuit 17 includes a shift register SHR1, a multiplexer MUX1, AND gates AD1 and AD2, an OR gate OR1, and FIFO register sets FRS1 and FRS2. The shift register SHR1 receives the read or write command received by the command circuit 17. The shift register SHR1 outputs one of signals BB<1> to BB<4> (BB<4:1>) after a lapse of clock cycles of the number which is based on a burst length preset in the memory device 1 from the reception of a read or write command based on the external clocks CLK and CLKb. The burst length is the number of times by which data to be read or written is output or input by one read or write command. The signals BB<1> to BB<4> correspond to the cycles of the burst length. For example, when the burst length is four, a high-level signal BB<1> is output. Similarly, when the burst length is eight or sixteen, a high-level signal BB<2> or BB<4> is output, respectively.

The signals BB<1> to BB<4> are received by the OR gate OR1, which has multiple inputs. The output of the OR gate OR1 serves as a signal BL4_BEND. The signal BL4_BEND is asserted (or, made high) when data of a length equal to the burst length four is received by the memory device 1. The following description is based on the example of the burst length being four.

The signal BL4_BEND is received by the AND gate AD1. The AND gate AD1 also receives a power supply potential (or, an H-level signal). The output of the AND gate AD1 is received by the FIFO register set FRS1. The signal BL4_BEND may be directly supplied to the FIFO register set FRS1.

The FIFO register set FRS1 includes n FIFO registers. n is determined in advance based on the specification of the memory device 1, and is, for example, RU(tWR/tCK/2). tWR is a write recovery time. The memory device 1 requires the write recovery time to complete a write from the reception of write data. The write recovery time is a time required for the data write from a page buffer (not shown) in the read and write circuit 12 to the memory cell array 11 to be completed, and is determined in advance based on the write characteristics of the memory device 1. tCK is the period of one cycle of the clocks CLK and CLKb. RU refers to the rounding up of values below the decimal point.

The FIFO register set FRS1 uses n FIFO registers to output a high-level signal BNWR<BK> for a particular period after a lapse of the clock cycles required for the write recovery, which is based on the value n, from the transition of the signal BL4_BEND to high.

The circuit for generating the signal BNWR<BK> has a structure similar to the existing circuit for generating a signal APCG<BK>. The circuit for generating the signal APCG<BK> includes the multiplexer MUX1, the AND gate AD2, and the FIFO register set FRS2. The multiplexer MUX1 receives the signals BB<1>, BB<2>, and BB<4>. Moreover, multiplexer MUX1 receives signals BL4, BL8, or BL16 from the controller 16. The signals BL4, BL8, and BL16 are based on the burst length set to the memory device 1. Based on the example of the burst length being four, when the multiplexer MUX1 receives the signal BB<1>, it outputs the same as a signal BEND. The signal BEND is asserted (or, made high) when data of a length equal to the burst length is received by the memory device 1.

The signal BEND is received by the AND gate AD2. The AND gate AD2 further receives a signal APEN. The signal APEN is asserted (or, high) when an auto-precharge is specified by a read or write command. The output of the AND gate AD2 is received by the FIFO register set FRS2. With a high-level signal APEN, the FIFO register set FRS2 starts to output a signal APCG<BK> after the clock cycles required for the write recovery, which is based on a value k, pass since it starts to receive the high-level signal BEND. The value k is the number of banks, and is, for example, eight.

Figure 4:
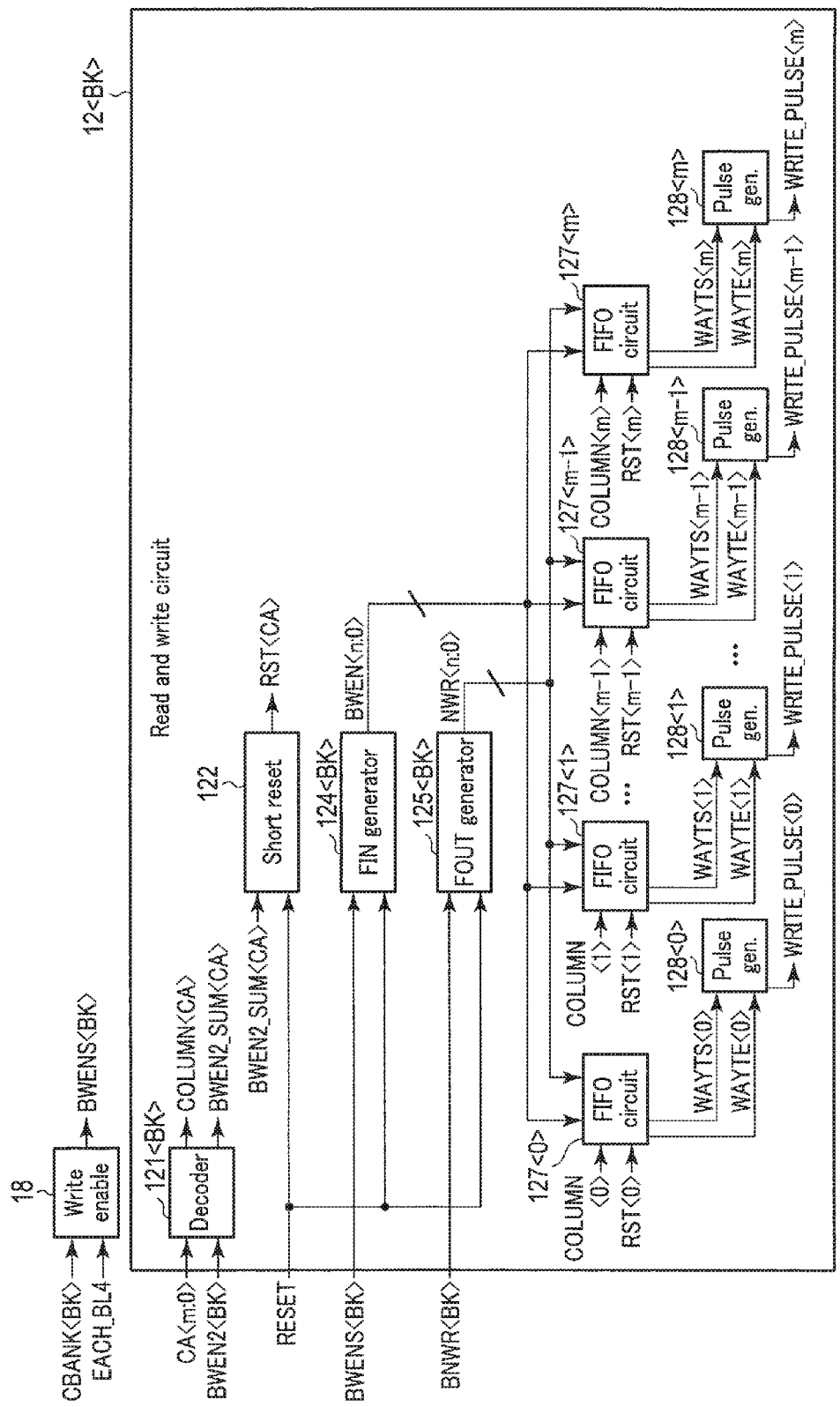
FIG. 4 illustrates functional blocks of a read and write circuit of the memory device of the first embodiment, and associated components in the memory device.

Each read and write circuit 12 has components and connections illustrated in FIG. 4. FIG. 4 illustrates functional blocks of a read and write circuit 12<BK> and associated components in the memory device 1. The memory device 1 includes a write enable circuit 18. The write enable circuit 18 receives a signal CBANK<BK> from the command circuit 17. The signal CBANK<BK> is based on the access-target bank specified by a write or read command, and transitions to high when the bank 10<BK> is specified. The signal CBANK<BK> is made high whenever a write or read command which specifies the bank 10<BK> is received by the memory device 1, and by extension the command circuit 17.

The write enable circuit 18 also receives a signal EACH_BL4 from the command circuit 17. The signal EACH_BL4 synchronizes with the clock signal CLK, and is asserted (or, made high) every time of a clock cycle of numbers corresponding to the burst length of four. The write enable circuit 18 generates and outputs a signal BWENS<BK> based on the signal CBANK<BK> and EACH_BL4.

The read and write circuit 12 includes a decoder 121<BK>, a reset controller 122, an FIN generator 124<BK>, an FOUT generator 125<BK>, m+1 FIFO circuits 127 (127<0> to 127<m>), and m+1 pulse generators 128 (128<0> to 128<m>). In other words, pulse generators 128 of the same number as the total number of the columns are provided.

The decoder 121<BK> receives a signal CA<m:0> from, for example, the command circuit 17, and receives a signal BWEN2<BK>. The signal BWEN2<BK> is a delayed signal BWENS<BK>. The set of signals CA<0> to CA<m> (CA<m:0>) specifies one column in conjunction. Specifically, each of signals CA<0> to CA<m> (CA<m:0>) has a value for specifying the access-target column, i.e., 0 or 1.

Based on the signals CA<m:0> and BWEN2<BK>, the decoder 121<BK> generates and outputs signals COLUMN<CA> and BWEN2_SUM<CA>. The value CA is an identifier (or, address) of one column, and is zero or a natural number of m or less. The signals COLUMN<0> to COLUMN<m> are asserted for a particular period when the column 0 to column m are specified (or, made high), respectively. The signal BWEN2_SUM<CA> in the read and write circuit 12<BK> is asserted for a period in which both signals COLUMN<CA> and BWEN2<BK> are asserted (or, high). The signal BWEN2_SUM<CA> is received by the reset controller 122. The reset controller 122 also receives a signal RESET from the command circuit 17. The signal RESET is asserted (or, made high) for a particular period for resetting an operation.

While the reset controller 122 is receiving an asserted signal RESET, it keeps a signal RST<CA> for column CA specified by the signal BWEN2_SUM<CA> asserted (or, high) for a particular period.

The FIN generator 124<BK> receives the signal BWENS<BK> from the write enable circuit 18, and receives the signal RESET from the command circuit 17. The FIN generator 124<BK> generates signals BWEN<0> to BWEN<n> (BWEN<n:0>) from the signal BWENS<BK>, and outputs the signals BWEN<0> to BWEN<n> (BWEN<n:0>). n is RU(tWR/tCK/2) as described above.

The FIN generator 124<BK> makes one of signals BWEN<0> to BWEN<n> high every time the signal BWENS<BK> is high. The FIN generator 124<BK> makes the signals BWEN<0> to BWEN<n> high one after another in ascending order of the number in< > whenever it receives a high signal BWENS<BK>. The FOUT generator 125<BK> receives the signal BNWR<BK> and the signal RESET from the command circuit 17.

The FOUT generator 125<BK> generates signals NWR<0> to NWR<n> (NWR<n:0>) from the signal BNWR<BK>, and outputs signals NWR<n:0>. The FOUT generator 125<BK> makes one of the signals NWR<0> to NWR<n> high for every period for which the signal BNWR<BK> is high. More specifically, the FOUT generator 125<BK> makes the signals NWR<0> to NWR<n> high one after another in ascending order of the number in< > whenever it receives a high signal BNWR<BK>.

The FIFO circuit 127<CA> includes plural FIFO registers, and receives the signals BWEN<n:0>, the signals NWR<n:0>, and the signal COLUMN<CA>. The FIFO circuit 127<CA> generates signals WAYTS<CA> and WAYTE<CA> based on the signals BWEN<n:0>, the signals NWR<n:0>, and the signal COLUMN<CA>, and outputs the signals WAYTS<CA> and WAYTE<CA>. Specifically, when the FIFO circuit 127<CA> receives an asserted signal BWEN<N> (N being zero or a natural number of n or less) while it is receiving the asserted signal COLUMN<CA>, it latches the high level and outputs an asserted (or, high-level) signal WAYTS<CA>. Furthermore, when the FIFO circuit 127 receives the asserted (or, high-level) signal NWR<N>, it outputs an asserted (or, high) signal WAYTE<CA>.

The pulse generator 128<CA> receives the signal WAYTS<CA> and the signal WAYTE<CA>. The pulse generator 128<CA> generates a signal WRITE_PULSE<CA> based on the signals WAYTS<CA> and WAYTE<CA>, and outputs the signal WRITE_PULSE<CA>. The signal WRITE_PLUS<CA> is kept asserted (or, high) for a period based on the signals WAYTS<CA> and WAYTE<CA>. The pulse generator 128<CA> is a set and reset (RS) type latch, for example. The RS latch receives the signal WAYTS<CA> at the set input and the signal WAYTE<CA> at the reset input.

The read and write circuit 12<BK> further has components illustrated in FIG. 5. The controller CC<BK> activates a signal GBL<CA> and GSL<CA> (not shown) based on a high-level signal WRITE_PULSE<CA>. The signal GBL<CA> selects a bit line BL from the column CA, and the signal GSL<CA> selects a source line SL from the column CA. The current source circuit<BK> and the current sink circuit CSK<BK> send in conjunction a write current through the memory cell MC coupled to the selected word line WL and coupled to the bit line BL and the source line of the selected column CA. A write current flows through the memory cell MC in the direction based on data to be written in the memory cell MC. The current source circuit CSR<BK> and the current sink circuit CSK<BK> send a write current while the signal WRITE_PULSE<CA> is asserted.

FIG. 6 illustrates components and connections of the FIN generator 124<BK>. The FIN generator 124<BK> has a shift register, which includes n+1 flip-flops 1241<0> to 1241<n>. The flip-flops 1241<0> to 1241<n> provide outputs B0 to Bn, respectively. The flip-flops 1241<0> to 1241<n> receive output Bn to Bn−1, respectively. All the flip-flops 1241 receive a signal ICLK1 at respective clock inputs, and receive a signal ICLK1b at respective inverted clock inputs. The signal ICLK1 has the same logic as the signal BWENS<BK>.

The outputs B0 to Bn are received by AND gates AD11<0> to AD11<n>, respectively. All the AND gates AD11<0> to AD11<n> receive a delayed signal BWENS<BK>. The AND gates AD11<0> to AD11<n> output the signals BWEN<0> to BWEN<n>, respectively.

Figure 7:
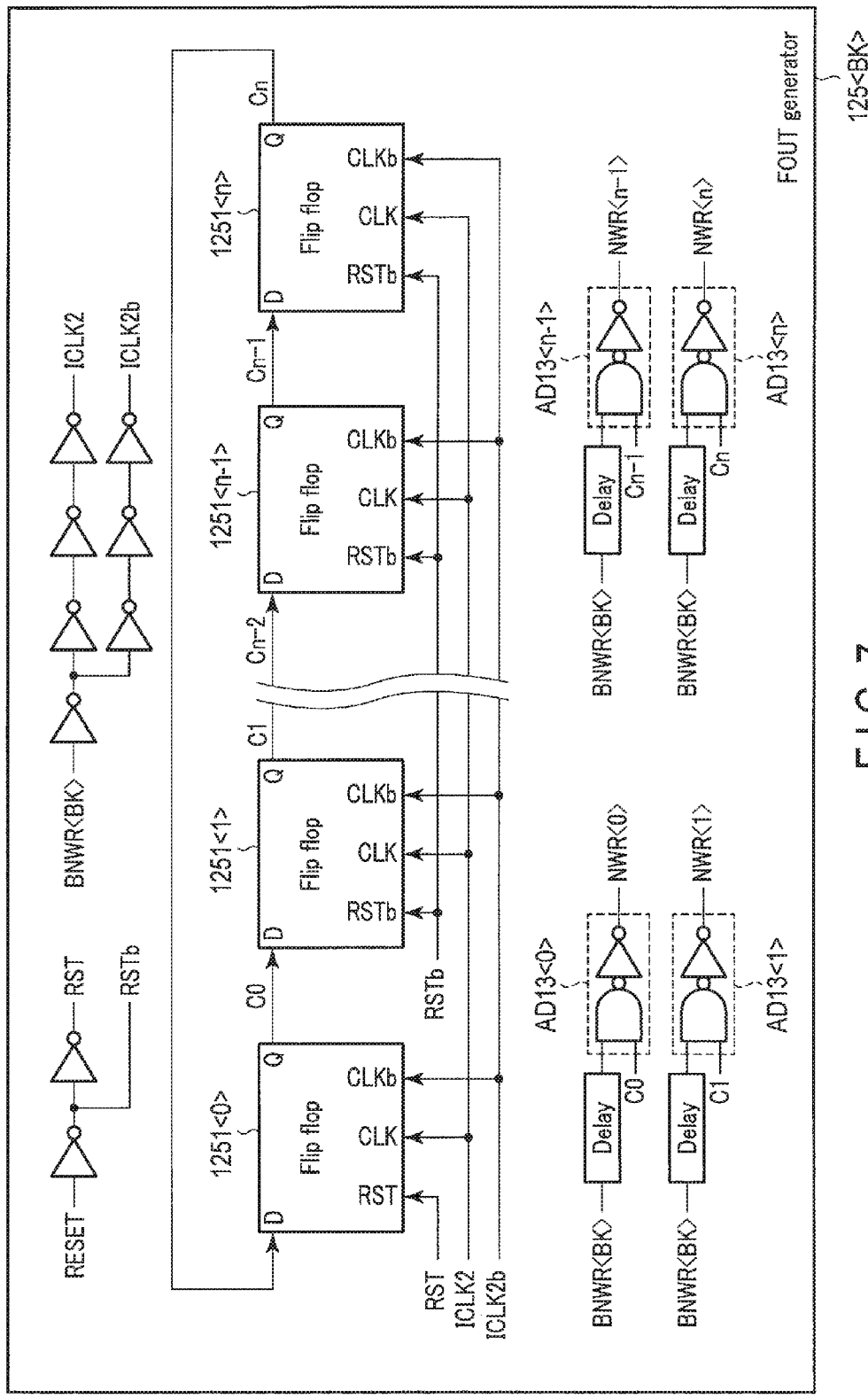
FIG. 7 illustrates components and connections of an FOUT generator of the memory device of the first embodiment.

FIG. 7 illustrates components and connections of the FOUT generator 125<BK>. The FOUT generator 125<BK> includes the same components as those in the FIN generator 124<BK>, which are coupled in the same manner as the FIN generator 124<BK>. However, a signal on each node differs from the corresponding signal in the FIN generator 124<BK>. The signal BWENS<BK> in the FIN generator 124<BK> is the signal BNWR<BK> in the FOUT generator 125<BK>. The signals ICLK2 and ICLK2b correspond to the signals ICLK1 and ICLK1b, respectively. The signals NWR<0> to NWR<n> correspond to the signals BWEN<0> to BWEN<n>, respectively. Outputs C0 to Cn correspond to the outputs B0 to Bn, respectively.

Figure 8:
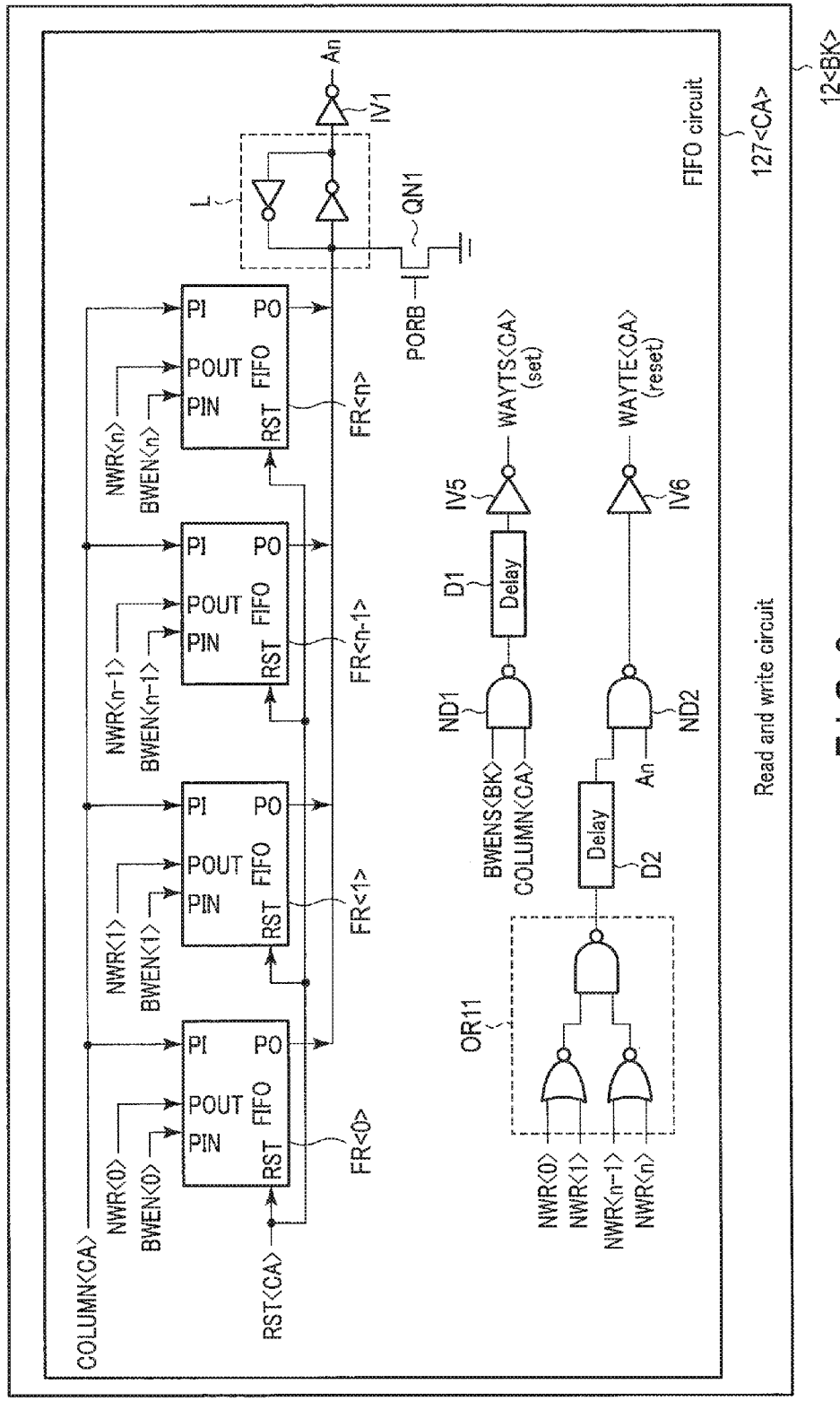
FIG. 8 illustrates components and connections of an FIFO circuit of the memory device of the first embodiment.

FIG. 8 illustrates components and connections of the FIFO circuit 127<CA> in the read and write circuit 12<BK>. As illustrated in FIG. 8, each FIFO circuit 127<CA> has n+1 FIFO registers FR<0> to FR<n>. Each FIFO register FR latches the logic of a signal received at the terminal PI at a timing based on a high-level signal received at the terminal PIN. Moreover, each FIFO register FR outputs the latched logic (or, data) from the terminal PO at a timing based on a high-level signal received at the terminal POUT. The FIFO registers FR<0> to FR<n> receive the signal COLUMN<CA> at the respective terminals PI, and receive the signal RST<CA> at the respective terminals RST. The FIFO registers FR<0> to FR<n> receive the signals BWEN<0> to BWEN<n> at their own terminals PIN, respectively. The FIFO registers FR<0> to FR<n> receive the signals NWR<0> to NWR<n> at their own terminals POUT, respectively.

The terminal PO of each FIFO register FR is coupled to the input of a latch circuit L and is grounded through a transistor QN1. The transistor QN1 is an n-type MOSFET and receives a signal PORB from the controller 16 at the gate, for example. The transistor QN1 is turned on in order to reset the data in the latch circuit L. The inverted version of the output of the latch circuit L serves as a signal An.

The FIFO circuit 127 further includes NAND gates ND1 and ND2, inverter circuits IV5 and IV6, a multiple-input OR gate OR11, and delay circuits D1 and D2. The NAND gate ND1 receives the signal BWENS<BK> and COLUMN<CA>. The output of the NAND gate ND1 is supplied to the delay circuit D1, which is coupled to the inverter IV5 in series. The output of the inverter IV5 serves as the signal WAYTS<CA>.

The OR gate OR11 receives the signals NWR<0> to NWR<n>, and supplies the output to the NAND gate ND2 through the delay circuit D2. The NAND gate ND2 further receives the signal An, and supplies the output to the inverter circuit IV6. The output of the inverter circuit IV6 serves as the signal WAYTE<CA>.

(Operation)

Figure 9:
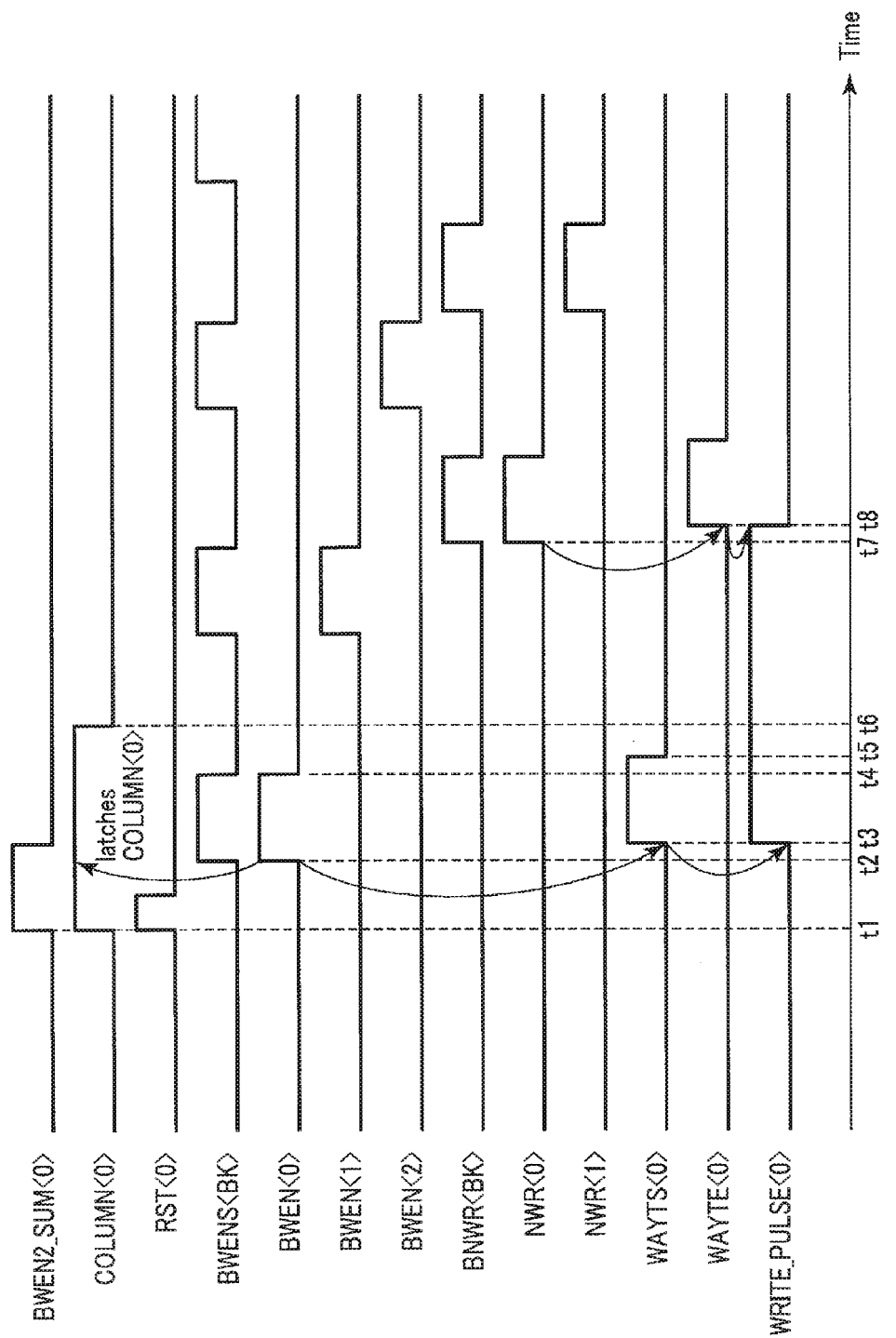
FIG. 9 illustrates some signals in a particular period during writes in the memory device of the first embodiment over time.

FIG. 9 illustrates some signals in a particular period during writes in the memory device of the first embodiment with time. Specifically, FIG. 9 illustrates the section regarding the write to the column 0 (CA=0) in the bank 10<BK>. In a write in any bank 10, transitions of the signals illustrated are the same.

All the illustrated signals at the time of the start of the operation of FIG. 9 are low (or, negated). When an instruction of a write to the column 0 of a particular selected page of the bank 10<BK> is received by the memory device 1, the decoder 121<BK> makes the signals BWEN2_SUM<0> and COLUMN<0> high from time t1. The signal BWEN2_SUM<0> maintains high for a particular period. The signal COLUMN<0> maintains high till time t6, for example.

Based on the transition of the signal BWEN2_SUM<CA> to high, the reset controller 122 in the read and write circuit 12<BK> keeps the signal RST<CA> high for a short period from the time t1. The high signal RST<CA> resets all the FIFO registers FR in the FIFO circuit 127<0>. If the signal COLUMN<0> which precedes this reset and contributes to generation of an uncompleted write pulse in the FIFO register FR remains, this is cleared.

The write enable circuit 18 makes the signal BWENS<BK> high from time t2 based on the instruction of the write to the column 0 of bank 10<BK>. Moreover, the memory device 1 keeps receiving write commands sequentially which specify further columns (for example, the columns 1 and 2, . . . ) in the selected page in the bank 10<BK>. By the sequential receptions of the write commands, the signal BWENS<BK> transitions high and low alternately periodically, also after it transitions to high from the time t2. Such periodic transitions of the signal BWENS<BK> causes the FIN generator 124<BK> to make the signals BWEN<0> to BWEN<n−1> high one after another. The signal BWEN<0> transitions to high from the time t2.

The transition of the signal BWEN<0> to high at the time t2 causes the FIFO register FR<0> to latch the high-level logic of the signal COLUMN<0>. Moreover, the transition of the signal BWENS<BK> to high from the time t2 causes the FIFO circuit 127<0> to make the signal WAYTS<0> high from time t3. The time t3 comes after the time t2 a little (equal to the period of delay by the delay circuit D1 of FIG. 4) later.

The transition of the signal WAYTS<0> to high at the time t3 causes the pulse generator 128<0> to output a signal WRITE_PULSE<0> of the high level from the time t3. With the transition of the signal WRITE_PULSE<0> to high, the read and write circuit 12<BK> supplies a write current to the memory cells MC of the column 0 from the time t3.

The signal WAYTS<0> transitions back to low at time t5. The time t5 comes after a period of the delay by the delay circuit D1 of FIG. 4 from time t4, at which the signal BWENS<BK> transitions to low.

The memory device 1 receives write data after reception of the first write command, which specifies the column 0. After reception of write data of the burst length set in the memory device 1 (four, in the current example) is completed, the signal BL4_BEND of FIG. 3 transitions to high by the logical operation by the command circuit 17 (FIG. 3). Then, the FIFO register set FRS1 makes the signal BNWR<BK> high from time t7 after a lapse of time specified by the FIFO register set FRS1 from the transition of the signal BL4_BEND to high. Moreover, with reception of sets of an additional write command and following corresponding write data, the signal BL4_BEND periodically transitions to high, and by extension the signal BNWR<BK> periodically transitions to high and low alternately also after it transitions to high from the time t7. Such periodic transitions of the signal BNWR<BK> causes the FOUT generator 124<BK> to make the signals BWEN<0> to BWEN<n-1> high one after another. Specifically, the signal NWR<0> transitions to high from the time t7.

The transition of the signal NWR to high at the time t7<0> causes the FIFO register FR<0> to output the latched signal (high-level). As a result, the high-level signal is latched in the latch circuit L, and the node An is kept high. The high-level signal NWR<0> makes the output of the OR gate OR1 high, and the output of the OR gate OR1 arrives at the NAND gate ND2 at time t8, which comes after the delay by the delay circuit D2. As a result, at the time t8, the signal WAYTE<CA> transitions to high.

The transition of the signal WAYTE<CA> to high at the time t8 causes the pulse generator 128<0> to output a low-level signal WRITE_PULSE<0> from the time t8. The transition of the signal WRITE_PULSE<0> to low causes the read and write circuit 12<BK> to stop supplying the write current to the memory cells MC of the column 0 at the time t8.

Although not illustrated in FIG. 9, one or more of the signals COLUMN<1> to COLUMN<m> which correspond to the write target columns keep high for respective particular periods. For example, the signal COLUMN<1> keeps high for a period including the period for which the signal BWEN<1> is high. As a result, the FIFO register FR<1> latches a high-level signal. Moreover, the signal WRITE_PULSE<1> for the column 1 transitions to high based on the high-level signal COLUMN<1>. The mechanism is the same as the mechanism described above for the column 0. Similarly, one or more of the signals WRITE_PULSE<2> to WRITE_PULSE<m> transition to high. The high-level period of none of signals COLUMN<0> to COLUMN<m> overlaps with the high-level period of another of the signals.

(Advantages)

Figure 10:
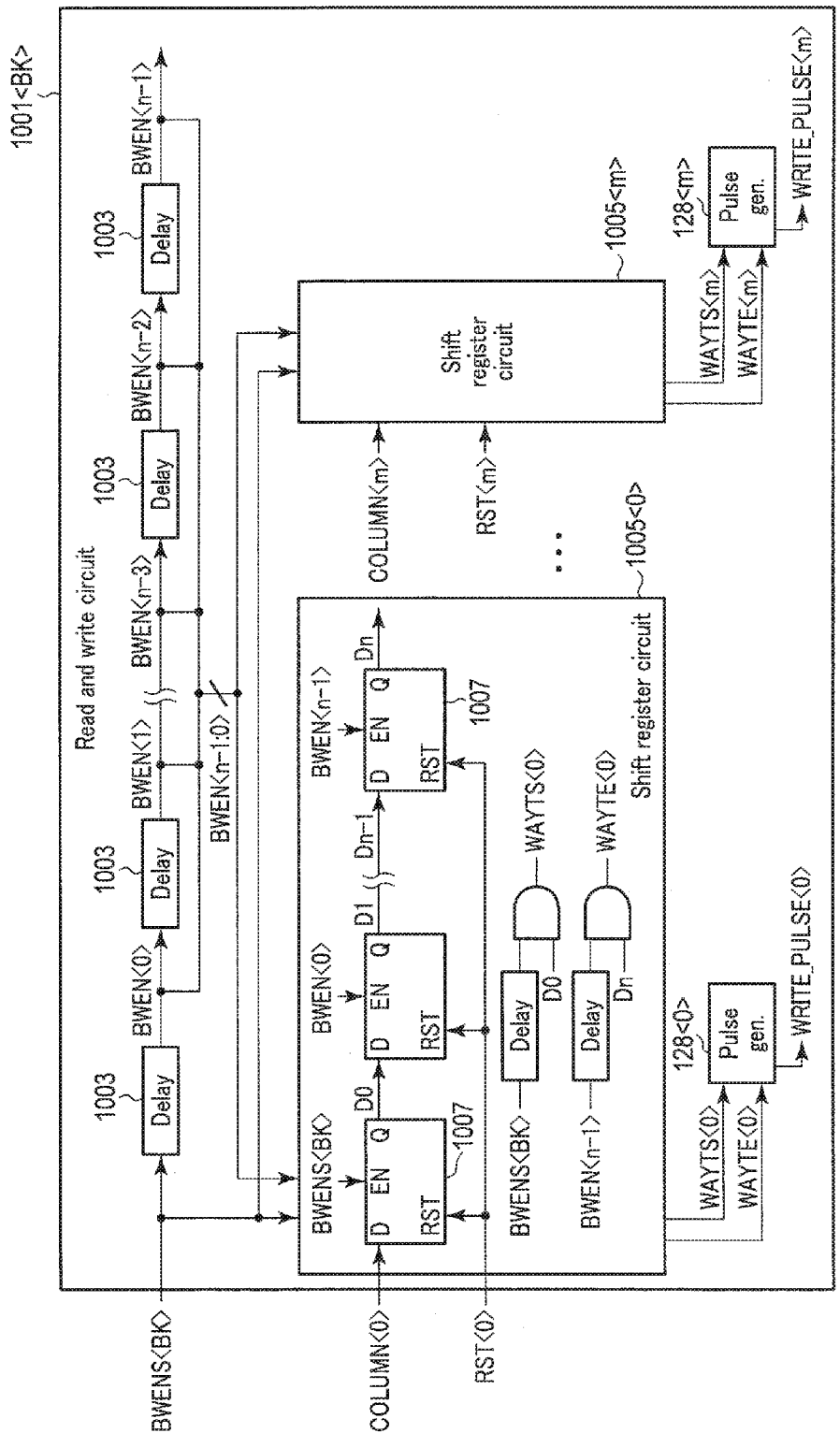
FIG. 10 illustrates components and connections of a read and write circuit for reference.

Write pulses can be generated through control by a circuit illustrated in FIG. 10. As illustrated in FIG. 10, the read and write circuit 1001<BK> includes n delay circuits 1003 coupled in series. The delay circuit 1003 of the first stage receives a signal BWENS<BK>. The signals BWEN<0> to BWEN<n-1> are generated by the set of the outputs of respective delay circuits 1003. The signals BWEN<0> to BWEN<n-1> keep high for respective particular periods one after another in this order. The signals BWENS<BK> and BWEN<0> to BWEN<n-1> are received by shift register circuits 1005<0> to 1005<m> provided for each column.

Each shift register circuit 1005 includes D-type flip flop circuits 1007 coupled in series. The flip-flop circuit 1007 in the first stage in the shift register circuit 1005<CA> for column CA receives a signal COLUMN<CA>. The logic of the signal COLUMN<CA> is latched by the flip-flop circuit 1007 in the first stage based on a timing of the signal BWENS<BK>. The latched logic is latched by flip-flop circuits 1007 one after another in order from the flip-flop circuit 1007 in the first stage to the flip-flop circuit 1007 in the last stage based on timings of signals BWEN<0> to BWEN<n-1>. With thus-obtained signals BWENS<BK> and BWEN<n-1>, the output D0 of the flip-flop circuit 1007 in the first stage, and the output Dn of the flip-flop circuit 1007 in the last stage, a write pulse WRITE_PULSE for column CA is generated.

According to the circuit of FIG. 10, the timing for the end of a write pulse is based on the signals BWEN<0> to BWEN<n-1>. The signals BWEN<0> to BWEN<n-1> are generated by the delay circuit 1003 inside a memory device, and, in other words, are not based on the clock outside the memory device. For this reason, the timing of the ends of write pulses is asynchronous with the controller outside the memory device, which in turn may make difficult the control of the timing of operation of the memory device and the controller. Moreover, the delay circuit 1003 generally consists of resistance elements and capacitor elements, and such a so-called RC delay circuit requires a large area. The delay circuit 1003 is located in the core section of the memory device, and it is undesirable to provide the delay circuit 1003 of a large area in the core section.

According to the memory device 1 of the first embodiment, as described, the signal WAYTE<CA> which instructs the end of a write pulse is based on the signal NWR, which is based on the signal BNWR, which is based on the signal BL4_BEND, which is based on the signals BB<4:1>, which is generated by the shift register SHR1 based on the clocks CLK and CLKb. This makes the timing of the end of a write pulse synchronize with the operation of the memory controller 2 which outputs the clocks CLK and CLKb.

Moreover, according to the memory device 1 of the first embodiment, the signal BWEN is generated based on the timing, which is based on the operation of the shift register (or, the set of flip-flops 1251). The shift register is configured by the combination of logical gates and, for this reason, does not need as large an area as RC delay circuits.

<Second Embodiment>

The second embodiment is based on the first embodiment, and relates to the control of timing of write backs in the device of the first embodiment.

Figure 11:
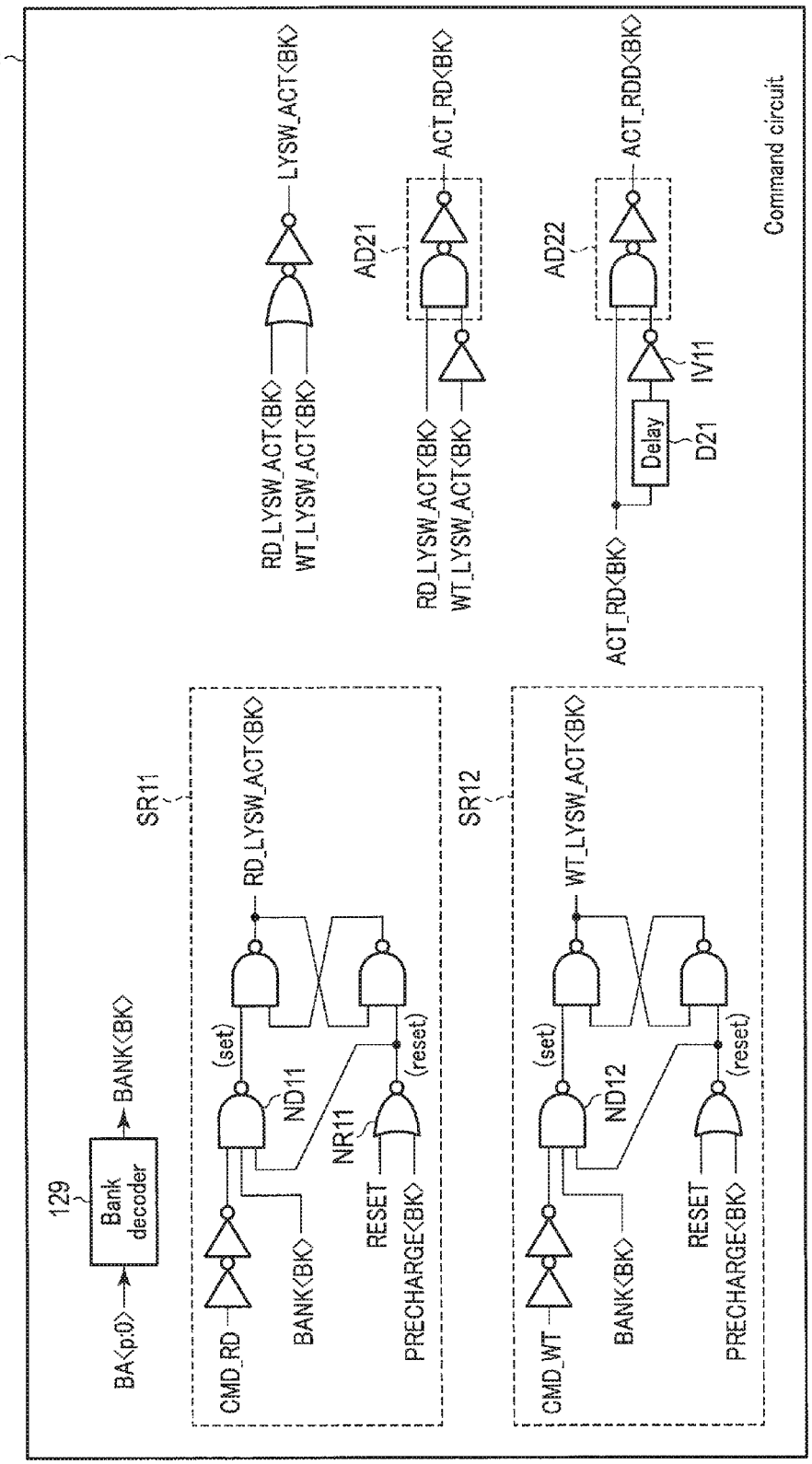
FIG. 11 illustrates some components and connections of a command circuit of a memory device of a second embodiment.

In the second embodiment, the read and write circuit 12 performs a write back in response to reception of the first read or write command after an active command. The active command is transmitted prior to a read or write command. For implementation of such a write back, the command circuit 17 has the structure illustrated in FIG. 11. FIG. 11 illustrates some components of the command circuit 17 of a memory device of the second embodiment. The command circuit 17 of the memory device 1 of the second embodiment includes components illustrated in FIG. 11 as well as those of the first embodiment.

The bank decoder 129 receives signals BA<p:0>. p is a natural number. The set of signals BA<0> to BA<p> specifies an access-target bank 11, is specified by the read or write command, and is a part of a column address. The column address is included in, for example, the active command. Based on the signals BA<p:0>, the bank decoder 129 generates a signal BANK<BK> and outputs the signal BANK<BK>. The signal BANK<BK> is asserted (or, made high) for a particular period when the bank BK is specified.

A set-reset type latch SR11 has a multiple-input NAND gate ND11 as the logical gate to receive the set input. The NAND gate ND11 receives signals CMD_RD and BANK<BK>. The signal CMD_RD is supplied from a particular component in the command circuit 17 (not shown), and is made high for a particular period when a read command is received by the memory device 1. Moreover, the latch SR11 has a NOR gate NR11 as the logical gate to receive the reset input. The NOR gate NR11 receives signals RESET and PRECHARGE<BK>. The signal PRECHARGE<BK> is supplied from a particular component in the command circuit 17 (not shown), and is made high for a particular period when a command which instructs precharging of the bank 10<BK> is received by the memory device 1. The latch SR11 outputs a high-level signal RD_LYSW_ACT<BK> while it is being set.

The set-reset type latch SR12 differs from the latch SR11 in respect of one input and the output. The latch SR12 receives a signal CMD_WT instead of the signal CMD_RD at a multiple-input NAND gate ND12 instead of the NAND gate ND11. Moreover, the latch SR12 outputs a signal WT_LYSW_ACT<BK> instead of the signal RD_LYSW_ACT<BK>.

A high-level signal LYSW_ACT<BK> is output when at least one of the signals RD_LYSW_ACT<BK> and WT_LYSW_ACT<BK> is high. The signal LYSW_ACT<BK> controls connection of the memory cells MC to the sense amplifier with the start of a read or write.

The signal RD_LYSW_ACT<BK> and the inverted version of the signal WT_LYSW_ACT<BK> are received by an AND gate AD21. The output of the AND gate AD21 serves as a signal ACT_RD<BK>. The signal ACT_RD<BK> is received by an AND gate AD22, and is also received by the AND gate AD22 through a delay circuit D21 and an inverter circuit IV11. The output of the AND gate AD22 serves as a signal ACT_RDD<BK>.

With such a command circuit 17 of the memory device of the second embodiment, the signal ACT_RD<BK> transitions to high when the read command which specifies the block 10<BK> is received after the active command which specifies block 10<BK>.

FIG. 12 illustrates additional components and connections of the command circuit 17. The command circuit 17 outputs an enabled signal BEND for one clock cycle from reception of a read command by the memory device 1 after a particular number of clock cycles. The enabling of the signal BEND is performed after the clock cycle of tRCDI+BL/2+tRTPmin. An example structure for such is illustrated in FIG. 12.

Figure 13:
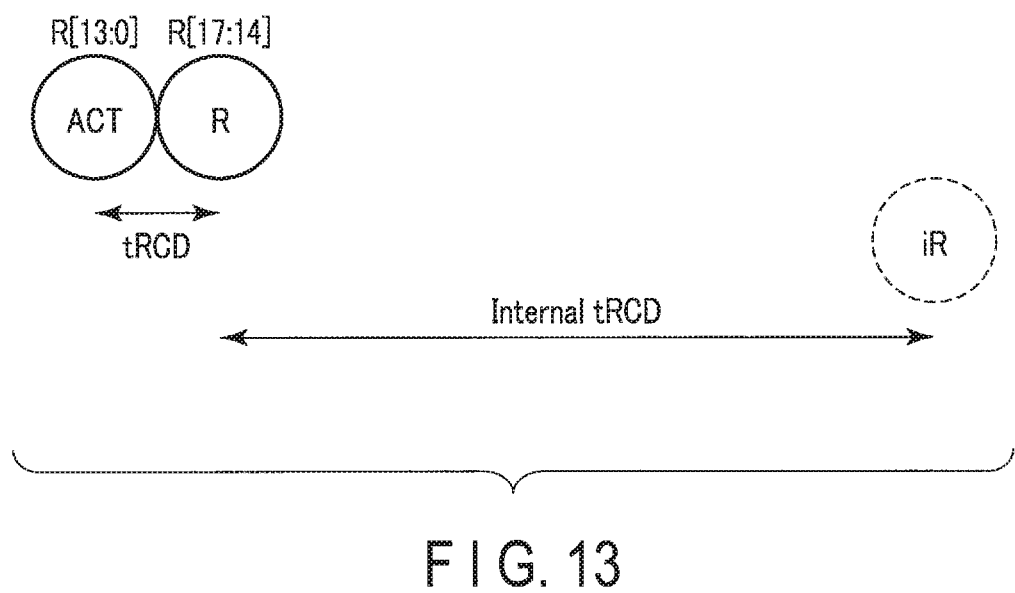
FIG. 13 illustrates timings of commands and associated times.

First, the signal ACT_RDD<BK> of FIG. 11 is received by a shift register SHR11 of FIG. 12. The shift register SHR11 has flip-flops coupled in series, and plural signals delayed by different numbers of clock cycles from the input of the shift register SHR1 are taken from respective outputs of different flip-flops. The taken signals are received by a multiplexer MUX11. The multiplexer MUX11 selects the output of one of the flip-flops so that the received signal is delayed by a period equal to the internal tRCDI by the shift register. The internal tRCDI is a time required from reception of the active command ACT to the start or read (iR), as illustrated in FIG. 13. The read command R precedes the active command ACT, and tRCD is a time required to accept the read command R (or write command) after the reception of the active command ACT.

Referring back to FIG. 12, the output of the multiplexer MUX11 is delayed by the clock cycles of BL/2 by the shift register SHR12. The output of the shift register SHR12 serves as the signal BEND.

The signal BEND serves as a signal PD_RDIND through the two inverter circuits IV31 and IV32 coupled in series. The signal PD_RDIND is received by a BNWR generator 171. The BNWR generator 171 outputs a high-level signal BNWR<BK> for a particular period after a lapse of a time after the start of reception of the signal PD_RDIND.

The command circuit 17 receives signals BA<2:0> serially at the shift register SHR21. The set of the signals BA<0> and BA<2> specifies the access-target bank 11, and is specified by a read or write command. The command circuit 17 also includes a multiplexer MUX12. The command circuit 17 uses the shift register SHR21 and the multiplexer MUX12 to delay the signals BA<2:0> by the clock cycles of the number of internal tRCDI(s) similarly to the shift register SHR11 and multiplexer MUX11. The delayed signals iBA<2:0> are received by the set FRS11 of FIFO registers. The plural FIFO registers are coupled in series, and different FIFO registers receive one of the signals iBA<2:0>. The output of the set of FIFO registers FRS11 is received by a bank decoder 173. The bank decoder 173 decodes the signals iBA<2:0> to generate the signal CBANK<BK>.

FIG. 14 illustrates a part of the read and write circuit of the second embodiment, and illustrates a part of the read and write circuit 12<BK>. The signals PD_RDIND and CBANK<BK> are received by an AND gate AD31. The output of the AND gate AD31 is received by an AND gate AD32. The AND gate AD32 further receives a signal ECC_ERROR from the ECC circuit 14. When the memory device 1 receives the first read or write command after an active command, the ECC circuit 14 detects errors of data in all the columns in the access-target page in the access-target bank 10<BK> specified by these commands. Then, the ECC circuit 14 outputs a high-level signal ECC_ERROR if the data of at least one column in the target page includes an error.

The output of the AND gate AD32 and the signal BWEN2 are received by an OR gate OR21. The output of the OR gate OR21 serves as a signal BWEN2_SUM. The inverted version of the signal BWEN2_SUM serves as the signal BWENS<BK>.

(Operation)

Figure 15:
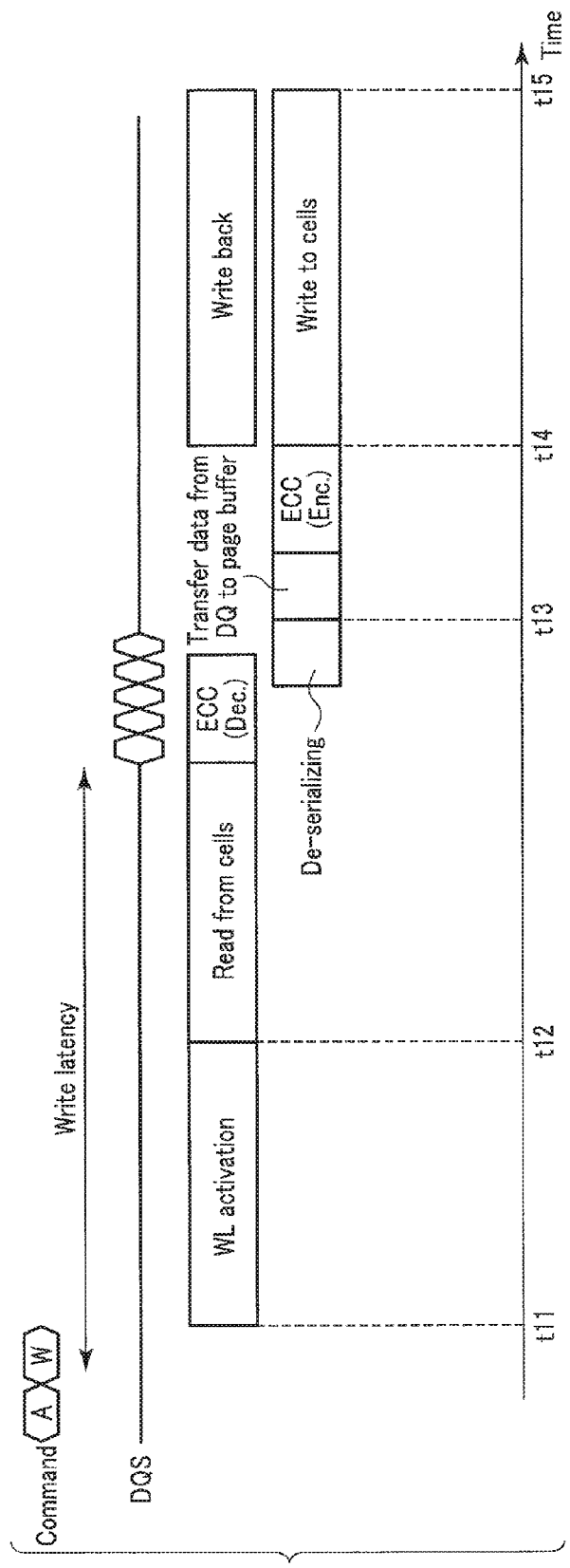
FIG. 15 illustrates a write and a write back in the memory device of the second embodiment.
Figure 16:
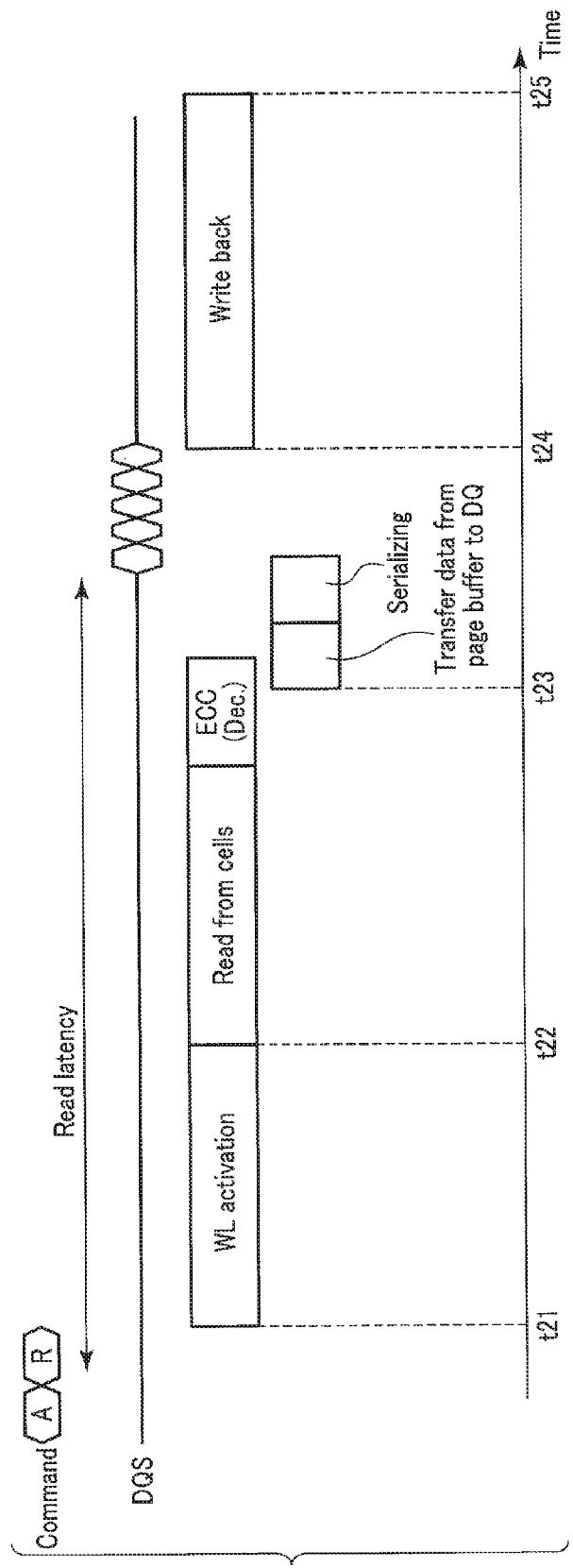
FIG. 16 illustrates a read and a write back in the memory device of the second embodiment.

FIGS. 15 and 16 illustrate operations of the memory device of the second embodiment. Specifically, FIG. 15 illustrates a write and a write back, and FIG. 16 illustrates a read and a write back. The memory device 1 utilizes reception of a write or read command to perform the write back.

The operation of FIG. 15 is performed in response to reception by the memory device 1 of the first write command after reception of an active command. The active command specifies the bank 10<BK> for access (or, write). Responding to the reception of the write command, the read and write circuit 12<BK> activates the selected word line WL in the write-target bank 10<BK> (time t11). The read and write circuit 12<BK> then reads the data of the whole page of the selected word line WL in the bank 10<BK>, or selected page (read from cells). The read and write circuit 12<BK> instructs the ECC circuit 14 to detect and correct errors in the read data. When the ECC circuit 14 receives the instruction, it detects errors of the selected page in the bank 10<BK> (ECC (Dec.)). When an error is detected, the signal ECC_ERROR of FIG. 14 transitions to high. FIG. 14 illustrates the case with an error detected.

The memory device 1 starts to receive write data following the write command. The write data keeps being received while being converted into a serial form. The reception of the write data is completed at time t13, and the write data is supplied to the page buffer in the read and write circuit 12<BK>. The write data supplied to the page buffer is added with parity by the ECC circuit 14 (ECC (Enc.)).

Moreover, responding to the completion of the reception of the write data, the signal BEND transitions to high by the section of the command circuit 17 in FIG. 12. In response to the high-level signal BEND, the signal BWENS<BK> transitions to high by the section of the read and write circuit 12<BK> in FIG. 14. In response to the transition of the signal BWENS<BK> to high, the write pulses for all the columns including erroneous bits in the selected page in the bank 10<BK> are enabled. This causes the read and write circuit 12<BK> to perform the write back from time t14. Specifically, the read and write circuit 12<BK> writes correct data in the memory cells MC which stored erroneous data.

Moreover, in response to the transition of the signal BWENS<BK> to high, the write to the write-target column is performed from the time t14. Specifically, among occurrences of write pulses for write backs for respective columns from time t14, during the write pulse for the write-target column, the write data is written in the write-target column.

The operation of FIG. 16 is performed in response to reception by the memory device 1 of the first read command after reception of the active command. The active command specifies the bank 10<BK> for access (or, read). The read differs from the write (FIG. 15) in that an enabled signal ACT_RDD<BK> is generated in response to the reception of the read command (see, FIG. 11). With the enabled signal ACT_RDD<BK>, the error correction is performed in the same manner as in the FIG. 15 case. With the error correction, when an error is included in the data of the read-target column, the error is corrected and the error-corrected read data is generated. When no error is included, the parity is removed from the data from the read-target column to generate the read data. The read data is transmitted to the input and output circuit 15 from time t23, and is transmitted to the memory controller 2 in a serial form.

As in the write case, the signal BWENS<BK> transitions to high after a lapse of the clock cycles which are based on the FIG. 12 circuit from the reception of the high-level signal CMD_RD by the FIG. 11 circuit due to the reception of the read command and when the data of one column of the selected page includes an error. With the high-level signal BWENS<BK>, the read and write circuit 12<BK> performs the write back from time t24 as in the write case.

(Advantages)

Figure 17:
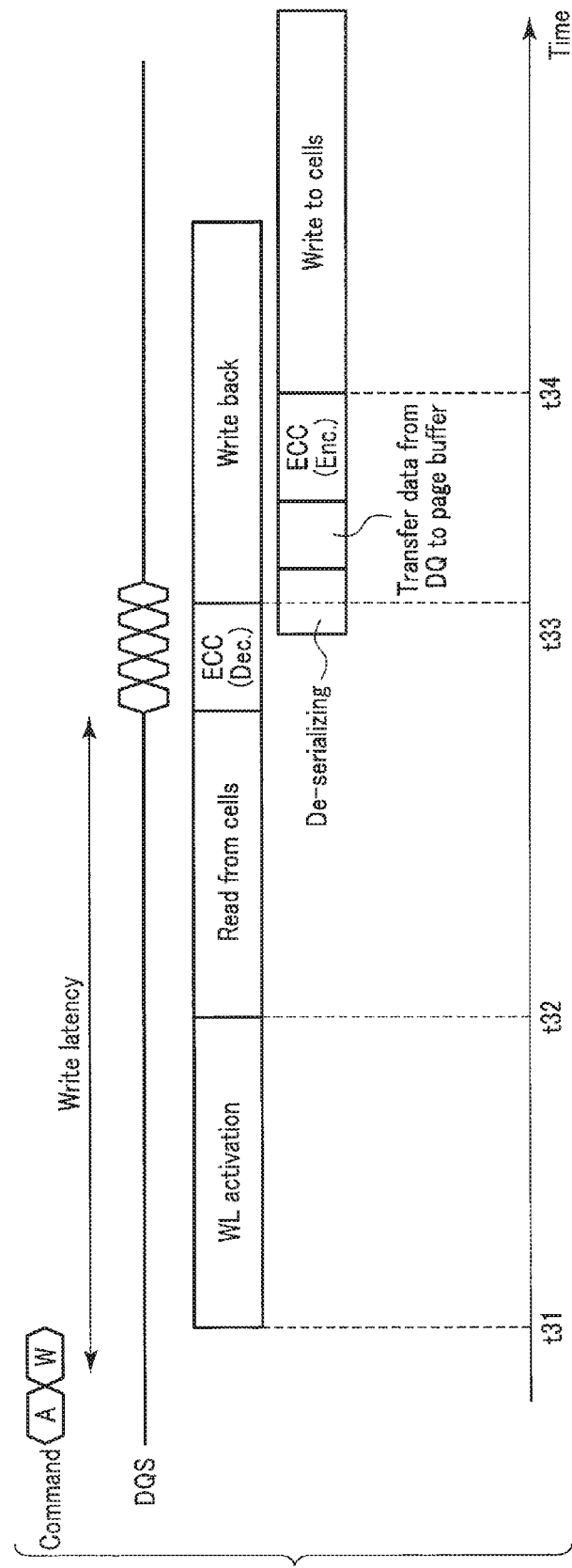
FIG. 17 illustrates a write and a write back in a memory device for reference.

The write back can be started at a timing based on the result of the operation inside a memory device. FIG. 17 illustrates a write and a write back in a memory device for reference. FIG. 18 illustrates a read and the write back in the memory device for reference. The operation up to error correction of data read from memory cells is the same as that in FIGS. 15 and 16. Both when the write back is based on the read command and the write command, once the read for write back starts, the write back starts when an error is detected to result in an enabled signal ECC_ERROR. For this reason, after the start of read, the write back starts with the signal ECC_ERROR as a trigger, and, for example, at time t33. The timing of the generation of the signal ECC_ERROR is based on the operation inside the memory device, and, therefore, the timing of the start of the write back cannot be known from and controlled by the outside.

Moreover, for a case of write back started by the write command (FIG. 17), the write back depends on the timing of error correction and detection, whereas the write instructed by the command (write to cells) depends on the timing of the end of the transmission of the write data and starts at a timing different from that for the write back (for example, t34). This produces a possibility that the necessity for execution of the write occurs during the write back to a particular column.

In the memory device 1 of the second embodiment, as described, the start of the write back accompanying reception of a read command is based on the signals BEND (PD_RDIND) and ECC_ERROR, and requires enabling of the signal BEND, even if the signal ECC_ERROR is enabled. The signal BEND is a signal on which the timing of the generation of the signal BNWR, which specifies timing of the end of the write pulse, is based. Therefore, the start of the write back is based on a timing counted backward from the end timing of the write pulse. For this reason, the write back also starts from the time prior to the end of the write pulse by a fixed length. In other words, the period of the write back is fixed.

Moreover, the write back and the write are both based on the signal which indicates the completion of the transmission of the write data (BEND or BL4_BEND), and start at the same timing. For this reason, the write back and the write are performed in periods of the same length, and the period for which the write pulse for the write for a particular column may occur matches the period for which the write pulse for the write back for that column occurs. Therefore, when the period for the column for the write starts while the write pulses for the write backs are formed one after another for multiple columns, the write is performed instead of the write back. For this reason, the write backs do not need to be interrupted to generate the pulse for the write.

<Third Embodiment>

The third embodiment is added to the first or second embodiment, and relates to transfer of signals between the FOUT generator 125 and the FIFO circuit 127.

Figure 19:
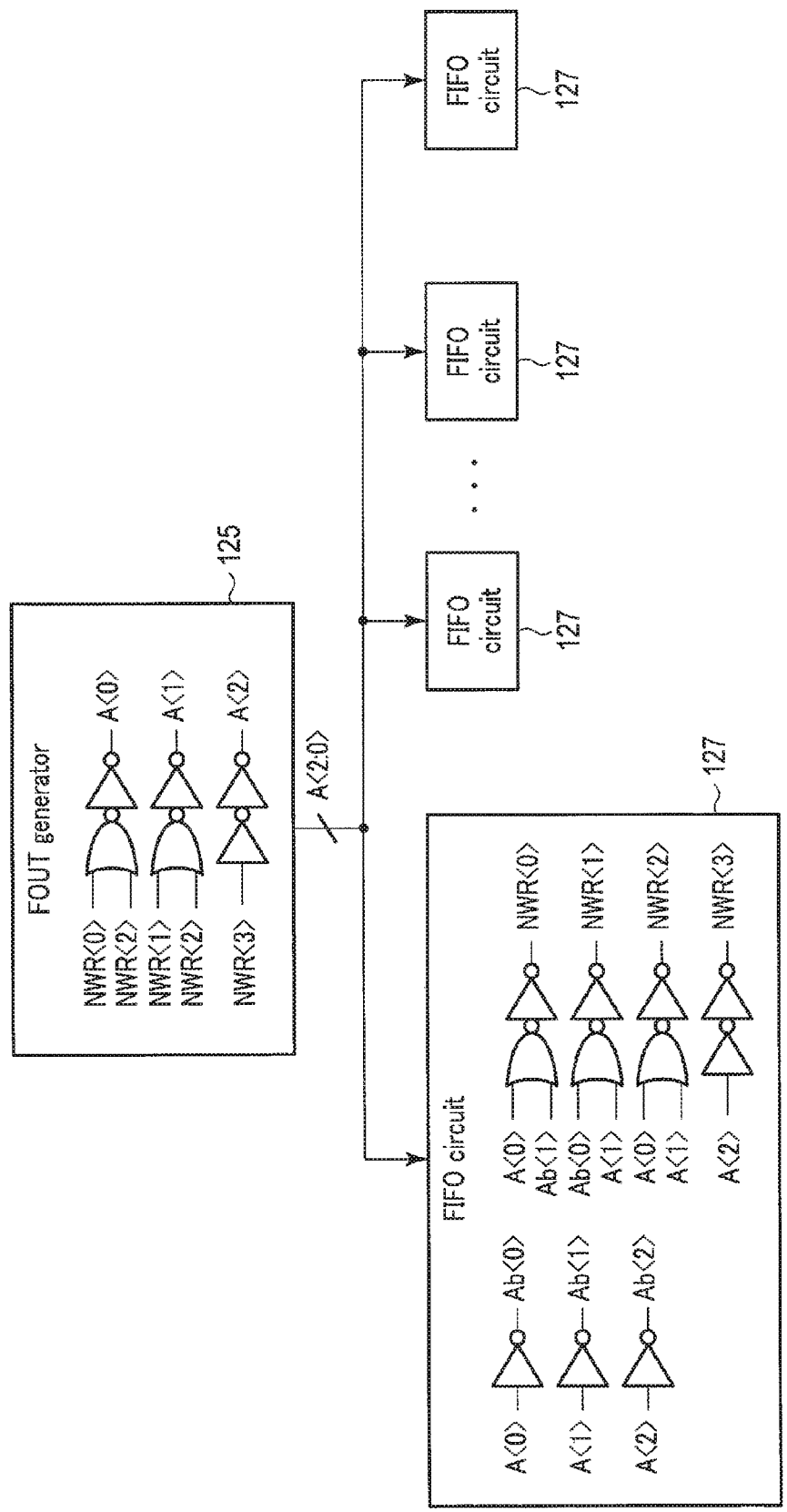
FIG. 19 illustrates an FOUT generator and a FIFO circuit in a memory device of a third embodiment.

FIG. 19 illustrates the FOUT generator 125 and the FIFO circuit 127 in a memory device 1 of the third embodiment. In the third embodiment, the signals NWR are coded, the signals obtained by the coding are transmitted, and the transmitted signals are decoded to restore the signals NWR. An example of components and connections for such are illustrated in FIG. 19. FIG. 19 and the following description are based on an example of the four signals NWR. Expanding the principle described in the following allows the signals NWR<n:0> to be coded and decoded.

The FOUT generator 125 has components and connections illustrated in FIG. 19 as well as the components and connections in the first and second embodiments. The FOUT generator 125 generates a signal A<0>, which is the logical sum of the signals NWR<0> and NWR<2>, and a signal A<1>, which is the logical sum of the signals NWR<1> and NWR<2>. The signal NWR<3> serves as a signal A<2>. The FOUT generator 125 supplies the signals A<0> to A<2> (A<2:0>) to each FIFO circuit 127.

Each FIFO circuit 127 has components and connections illustrated in FIG. 19 as well as the components and connections in the first and second embodiments. The FIFO circuit 127 generates a signal NWR<0>, which is the logical product of the signals A<0> and Ab<1>, generates a signal NWR<1>, which is the logical product of the signals Ab<0> and A<1>, and generates a signal NWR<2>, which is the logical sum of the signals A<0> and A<1>.

The components of FIG. 19 allow the four signals NWR<0> to NWR<3> to be coded into three signals A<0> to A<2>, and the signals NWR<0> to NWR<3> to be restored through decoding as illustrated in FIG. 20. Such coding and decoding enable n+1 signals NWR<0> to NWR<n> to be transmitted from the FOUT generator 125 to the FIFO circuit 127 by a reduced number of interconnects.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
a memory cell which transitions to a first state or a second state by a first current flowing in the memory cell; and
a first circuit configured to stop supplying the first current when a first number of cycles of a clock signal lapses from reception of write data, the clock signal being input from outside the memory device;
wherein the first circuit comprises:
a first register configured to store a signal received at an input of the first circuit in response to a storing instruction, and output the stored signal in response to an output instruction,
a pulse generator configured to negate a first signal based on a signal being output from the first register, and
a write circuit configured to stop supplying the first current by the first signal being negated, and
wherein the output instruction is output when the first number of cycles of the clock signal lapses from the reception of the write data.

2. The device of claim 1, further comprising:
a second circuit configured to generate a control signal whose logic changes based at least in part on the clock signal.

3. The device of claim 2, wherein:
the control signal changes the logic when the first number of cycles of the clock signal lapses from the reception of the write data.

4. The device of claim 3, wherein:
the first circuit further comprises a first generator configured to receive the control signal, output first to $P^{th}$ (P being a natural number of two or more) output timing signals, and make one of the first to $P^{th}$ timing signals a first level in every period in which the control signal is at a first level.

5. The device of claim 4, wherein:
the control signal remains at the first level for a period whenever write data is being received by the memory device.

6. The device of claim 5, wherein:
the first circuit further comprises a second generator configured to receive a second control signal, output first to $Q^{th}$ (Q being a natural number of two or more) start timing signals, and make one of the first to $Q^{th}$ start timing signals a first level in every period in which the second control signal is at a first level.

7. The device of claim 6, wherein:
the first register is configured to receive the first start timing signal as the storing instruction, and receive the first output timing signal as the output instruction.

8. The device of claim 7, further comprising:
second to $n^{th}$ registers configured to respectively receive the second to $n^{th}$ start timing signals, wherein the second to $n^{th}$ registers are configured to respectively receive the second to nth output timing signals, and
for each case of N (N being a natural number greater than or equal to two and lower than or equal to n) being two to n, the $N^{th}$ register is configured to latch a signal which the $N^{th}$ register is receiving at an input in response to reception of the $N^{th}$ start timing signal, and output the latched signal in response to reception of the $N^{th}$ output timing signal.

9. The device of claim 1, wherein:
the first circuit comprises a second circuit and third circuits of a second number,
the second circuit outputs first signals of a third number,
the third number is smaller than the second number, and
one of the third circuits generates second signals of the second number from the first signals of the third number.

10. The device of claim 9, wherein:
the second circuit generates the first signals of the third number from third signals of the second number.

11. The device of claim 9, wherein:
the second circuit and one of the third circuits are coupled by interconnects of the third number.

12. A memory device comprising:
a memory cell which transitions to a first state or a second state by a first current flowing in the memory cell; and
a first circuit configured to stop supplying the first current when a first number of cycles of a clock signal lapses from reception of write data, and supply the first current based on a second number of cycles of the clock signal having passed after a read command is received by the memory device, the clock signal being input from outside the memory device.

13. The device of claim 12, wherein:
the first circuit is configured to stop supplying the first current based on a third number of cycles of the clock signal having passed from the start of the supply of the first current.

14. The device of claim 13, wherein:
the first circuit is configured to start supplying the first current when data stored in one of memory cells specified by the read command includes an error.

15. The device of claim 14, wherein:
the first circuit is configured to supply the first current when the read command is received by the memory device after a first command.

16. The device of claim 12, wherein:
the first circuit is configured to supply a second current when data stored in one of memory cells specified by a write command includes an error in response to completion of reception of the write data by the first circuit, and
the second current makes the one of memory cells a first state or a second state when the second current flows in the one of memory cells.

17. The device of claim 16, wherein:
the first circuit is configured to supply the second current when the write command is received by the memory device after a first command.

18. A memory device comprising:
a memory cell which transitions to a first state or a second state by a first current flowing in the memory cell; and
a first circuit configured to start supplying the first current to the memory cell based on a write command being received by the memory device, and stop supplying the first current based on a timing which is based on a clock signal input from outside the memory device;
wherein the first circuit comprises:
  a first register configured to store a signal received at an input of the first circuit in response to a storing instruction, and output the stored signal in response to an output instruction,
  a pulse generator configured to negate a first signal based on a signal being output from the first register, and
  a write circuit configured to stop supplying the first current by the first signal being negated, and
wherein the output instruction is based on the timing different from reception of the write command.

* * * * *